United States Patent
Bryan et al.

(10) Patent No.: US 11,659,694 B2
(45) Date of Patent: May 23, 2023

(54) COMPUTER SYSTEM WITH EXTERNAL BYPASS AIR PLENUM

(71) Applicant: Amazon Technologies, Inc., Seattle, WA (US)

(72) Inventors: David Edward Bryan, Seattle, WA (US); Christopher Strickland Beall, Woodinville, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/662,400

(22) Filed: May 6, 2022

(65) Prior Publication Data
US 2022/0264770 A1    Aug. 18, 2022

Related U.S. Application Data

(63) Continuation of application No. 16/698,467, filed on Nov. 27, 2019, now Pat. No. 11,330,740, which is a
(Continued)

(51) Int. Cl.
*H05K 7/20* (2006.01)
*G06F 1/20* (2006.01)
(Continued)

(52) U.S. Cl.
CPC .......... *H05K 7/20754* (2013.01); *G06F 1/20* (2013.01); *G06F 1/206* (2013.01); *H01L 23/467* (2013.01);
(Continued)

(58) Field of Classification Search
CPC ... H01L 23/473; H01L 23/467; H01L 23/427; G06F 1/20; G06F 1/206; G06F 1/183;
(Continued)

(56) References Cited

U.S. PATENT DOCUMENTS 5,375,038 A    12/1994 Hardt
5,412,534 A    5/1995 Cutts et al.
(Continued)

OTHER PUBLICATIONS

U.S. Appl. No. 16/549,220, filed Aug. 23, 2019 Christopher Strickland Beall et al.

*Primary Examiner* — Adam B Dravininkas
(74) *Attorney, Agent, or Firm* — Alexander A. Knapp; Kowert, Hood, Munyon, Rankin & Goetzel, P.C.

(57) ABSTRACT

A rack-mountable computer system enables an airflow that cools components in an upstream portion of the computer system interior to be cooled through mixing with a bypass airflow downstream of the components in the upstream portion. The mixed airflow can cool components in a downstream portion of the interior. The bypass airflow is directed by a bypass plenum that is unencompassed by the separate plenum that directs the airflow to cool the upstream portion components. The bypass plenum can be at least partially established by an external surface the computer system and one or more external structures, including an external surface of an adjacently mounted computer system. Relative flow rates through the separate plenums can be adjusted, via flow control elements, to separately control heat removal from components upstream and downstream of the air mixing, based at least in part upon air temperatures in the separate interior portions.

20 Claims, 10 Drawing Sheets

Related U.S. Application Data continuation of application No. 15/798,272, filed on Oct. 30, 2017, now Pat. No. 10,499,546, which is a continuation of application No. 14/301,271, filed on Jun. 10, 2014, now Pat. No. 9,807,911.

(51) Int. Cl.
  *H01L 23/467* (2006.01)
  *H05K 13/04* (2006.01)
  *H01L 23/473* (2006.01)

(52) U.S. Cl.
  CPC ......... *H05K 7/20727* (2013.01); *H05K 13/04* (2013.01); *H01L 23/473* (2013.01)

(58) Field of Classification Search
  CPC .... G06F 2200/201; G06F 1/187; G06F 1/181; H05K 7/20836; H05K 7/20736; H05K 7/20745; H05K 7/2079; H05K 7/20809; H05K 7/20727; H05K 7/20781; H05K 7/20772; H05K 7/20754; H05K 7/20827; H05K 7/20818; H05K 7/20145; H05K 7/20718; H05K 7/20572; H05K 7/20563; H05K 7/20009; H05K 1/0203
  See application file for complete search history.

(56) References Cited

U.S. PATENT DOCUMENTS

| | | | |
|---|---|---|---|
| 5,424,915 A | 6/1995 | Katooka et al. | |
| 6,052,282 A | 4/2000 | Sugiyama et al. | |
| 6,336,691 B1 | 1/2002 | Maroney et al. | |
| 6,421,238 B1 | 7/2002 | Negishi | |
| 6,621,693 B1 | 9/2003 | Potter et al. | |
| 6,980,435 B2 * | 12/2005 | Shum | H05K 7/20581 361/691 |
| 7,042,720 B1 | 5/2006 | Konshak et al. | |
| 7,167,363 B1 | 1/2007 | Cushman et al. | |
| 7,248,472 B2 | 7/2007 | Vinson et al. | |
| 7,256,992 B1 | 8/2007 | Stewart et al. | |
| 8,451,600 B1 | 5/2013 | Ross | |
| 8,743,549 B2 | 6/2014 | Frink et al. | |
| 9,363,926 B1 | 6/2016 | Bryan et al. | |
| 9,411,525 B2 | 8/2016 | Frink et al. | |
| 9,448,601 B1 | 9/2016 | Bryan et al. | |
| 9,694,451 B1 | 7/2017 | Ross | |
| 9,785,600 B2 | 10/2017 | Frink et al. | |
| 9,807,911 B1 | 10/2017 | Bryan et al. | |
| 9,936,611 B1 | 4/2018 | Bryan et al. | |
| 9,949,407 B1 | 4/2018 | Beall | |
| 10,398,060 B1 | 8/2019 | Bryan et al. | |
| 10,426,060 B2 | 9/2019 | Beall et al. | |
| 10,499,546 B2 | 12/2019 | Bryan et al. | |
| 2003/0156385 A1 | 8/2003 | Askeland et al. | |
| 2004/0004813 A1 | 1/2004 | Coglitore et al. | |
| 2004/0217072 A1 | 11/2004 | Bash et al. | |
| 2005/0168932 A1 | 8/2005 | Selvidge et al. | |
| 2005/0259392 A1 * | 11/2005 | Vinson | G06F 1/20 361/679.47 |
| 2005/0259393 A1 * | 11/2005 | Vinson | G06F 1/20 165/80.3 |
| 2006/0120043 A1 * | 6/2006 | Wolford | H05K 1/0272 361/695 |
| 2007/0076370 A1 | 4/2007 | Mongia et al. | |
| 2007/0190927 A1 | 8/2007 | Bash et al. | |
| 2007/0223200 A1 | 9/2007 | Fujiya et al. | |
| 2012/0069514 A1 | 3/2012 | Ross | |
| 2012/0243170 A1 | 9/2012 | Frink et al. | |
| 2012/0243172 A1 * | 9/2012 | Ross | H05K 7/1488 361/679.37 |
| 2013/0044430 A1 | 2/2013 | Carl, Jr. et al. | |
| 2013/0107454 A1 | 5/2013 | Wilke et al. | |
| 2013/0160984 A1 | 6/2013 | Cash et al. | |
| 2015/0036284 A1 | 2/2015 | Ross et al. | |

* cited by examiner

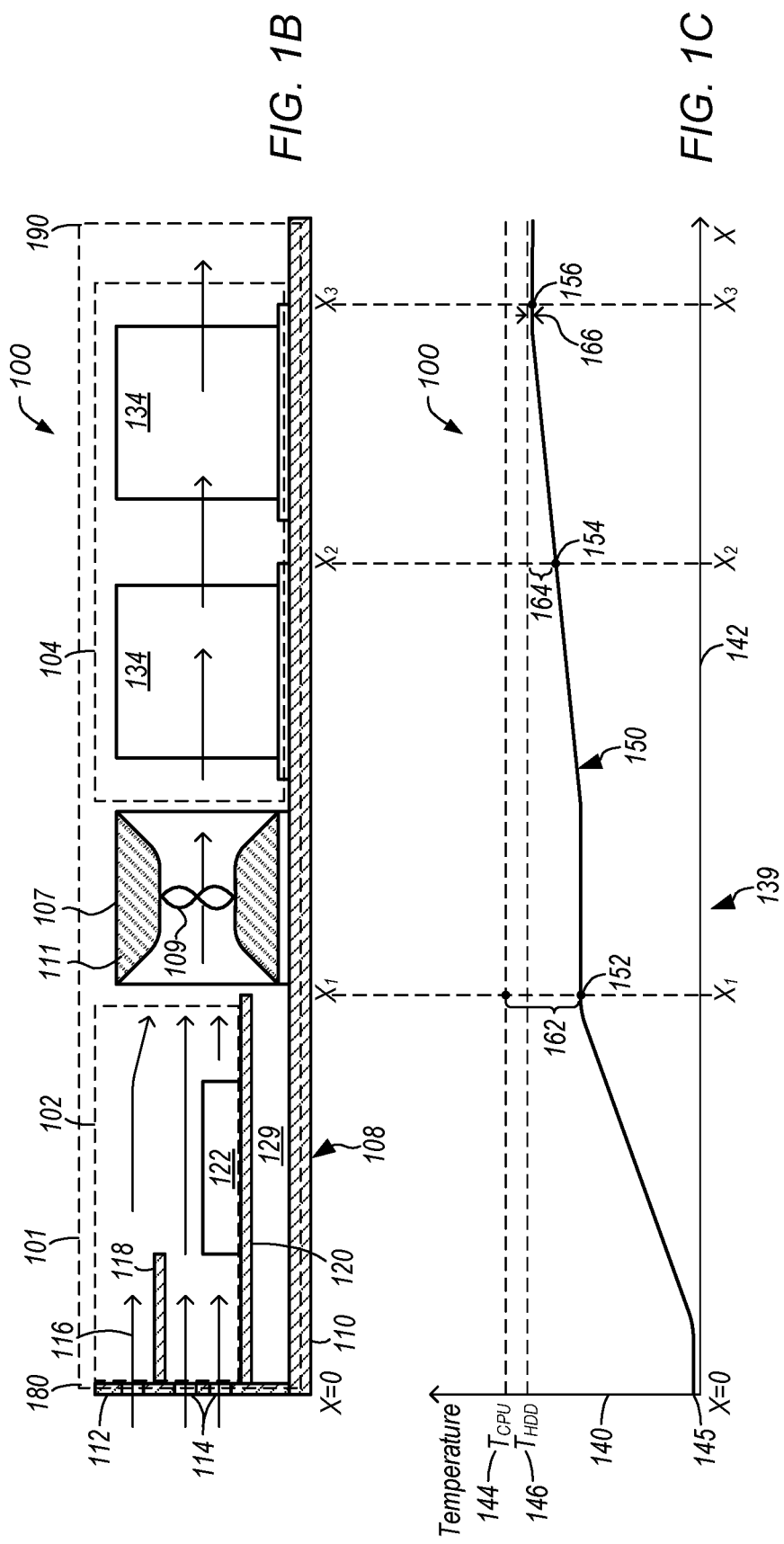

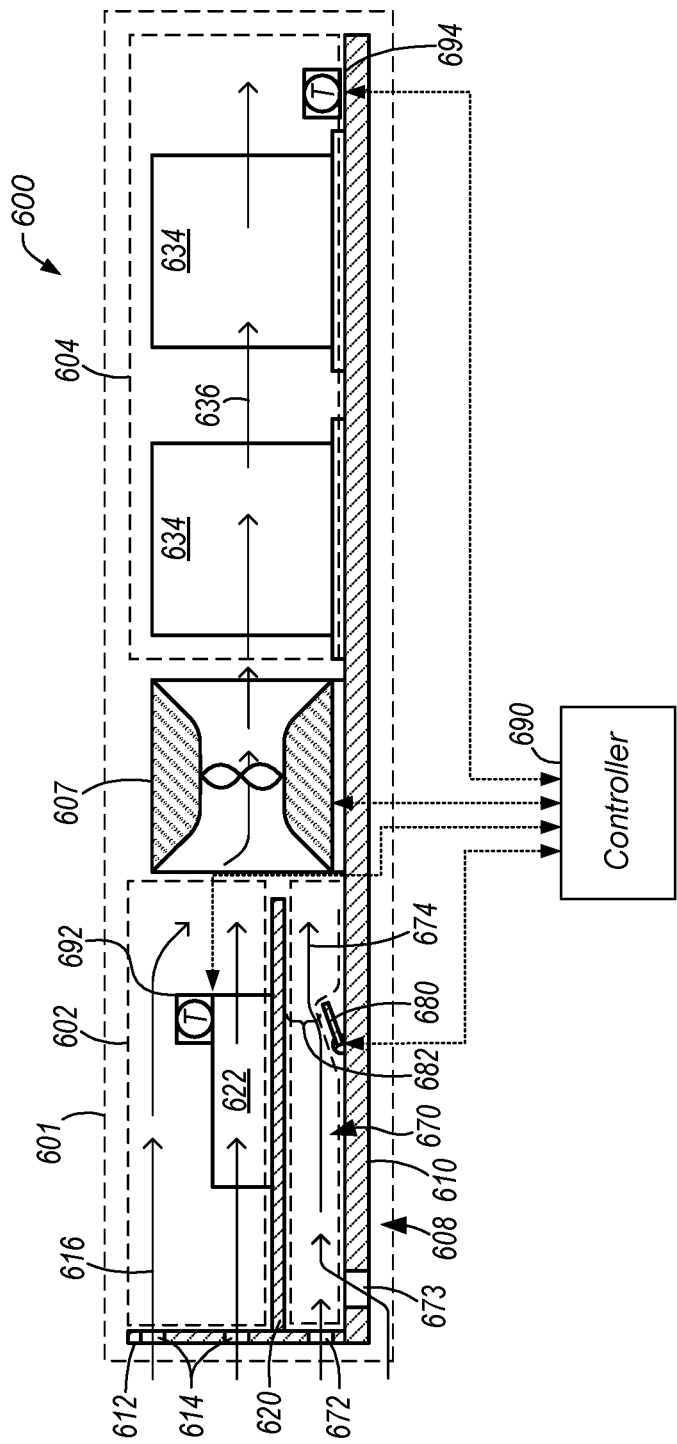

COMPUTER SYSTEM WITH EXTERNAL BYPASS AIR PLENUM

This application is a continuation of U.S. patent application Ser. No. 16/698,467, filed Nov. 27, 2019, which is a continuation of U.S. patent application Ser. No. 15/798,272, filed Oct. 30, 2017, now U.S. Pat. No. 10,499,546, which is a continuation of U.S. patent application Ser. No. 14/301,271, filed Jun. 10, 2014, now U.S. Pat. No. 9,807,911, which are hereby incorporated by reference herein in their entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Some computer systems, which can include servers, typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some servers include a number of components that are mounted in an interior of the server. The components, which can include printed circuit boards (for example, a motherboard) and mass storage devices, can support one or more components that generate waste heat, referred to hereinafter as "heat-producing components". For example, a motherboard can support a central processing unit, and mass storage devices can include hard disk drives which include motors and electronic components that generate heat. Some or all of this heat must be removed from the components to maintain continuous operation of a server. The amount of heat generated by the central processing units, hard disk drives, etc. within a data room may be substantial. Heat may be removed from the heat-producing components via an airflow flowing through a server.

In some cases, cooling systems, including air moving systems, may be used to induce airflow through one or more portions of a data center, including airflow through a rack-mounted server that includes various heat-producing components. However, some servers direct airflow through an interior that includes multiple heat-producing components, so that air removes heat as it passes through the interiors, so that air passing over heat-producing components in a downstream portion of the server has a reduced heat removal capacity relative to air passing over heat-producing components in an upstream portion of the server. As a result, less heat can be removed from downstream heat-producing components than upstream heat-producing components. In some cases, the downstream heat-producing components are more sensitive to heat than the upstream heat-producing components, which can result in a suboptimal configuration.

BRIEF DESCRIPTION OF THE DRAWINGS

FIG. 1B is a schematic diagram illustrating a side view of a computer system that includes heat-producing components installed in upstream portions and downstream portions of the computer system chassis interior, according to some embodiments.

FIG. 1C is a graphical representation of a temperature profile of an airflow through a computer system chassis interior that removes heat from heat-producing components installed in an upstream portion and heat-producing components installed in a downstream portion of a computer system chassis interior, according to some embodiments.

FIG. 6 is a schematic diagram illustrating a side view of a computer system chassis interior that includes an adjustable flow control element, a temperature sensor device, and an air moving device that are communicatively coupled to a controller, according to some embodiments.

Figure 1A:
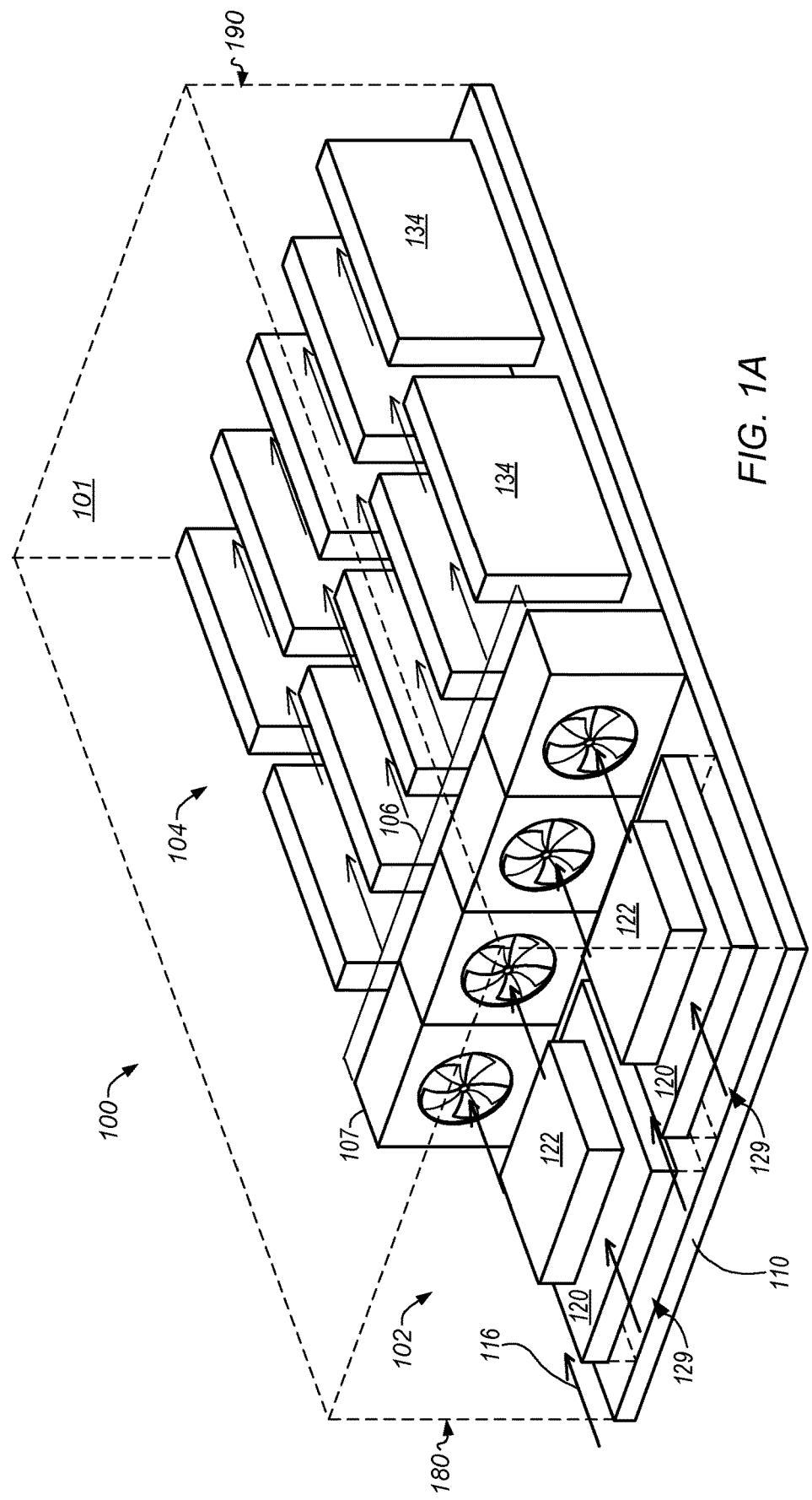
FIG. 1A is a schematic diagram illustrating a perspective view of a computer system that includes heat-producing components installed in upstream portions and downstream portions of the computer system chassis interior, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations and removing waste heat from various heat-producing components in computer systems, are disclosed. According to one embodiment, a system for storing data includes one or more rack-mountable computer systems mounted in a rack, where the computer systems include a chassis that encompasses a chassis interior. A circuit board, which is installed in an upstream portion of the chassis interior that is near an air inlet vent, has an upper surface upon which an upstream heat-producing component is installed. An inlet air plenum directs an inlet air flow from the inlet end of the chassis through at least the upstream portion of the chassis interior to remove heat from the upstream heat-producing component installed on the upper surface of the circuit board. A bypass air plenum extends beneath the circuit board and is unencompassed by the inlet air plenum. The bypass air plenum directs a bypass air flow that is isolated from the inlet air flow to mix with the inlet air flow downstream of the upstream heat-producing component to establish a mixed air flow. The mixed air is directed into a downstream portion of the chassis interior to remove heat from a downstream heat-producing component installed in the downstream portion.

According to one embodiment, a computer system includes a chassis, having an inlet end, which at least partially encompasses a chassis interior, an inlet air plenum, and a bypass air plenum. The inlet air plenum directs an inlet air flow through an upstream portion of the chassis interior to remove heat from an upstream heat-producing component installed in the upstream portion. The bypass air plenum extends through a portion of the chassis interior that is unencompassed by the inlet air plenum and directs a bypass air flow that is isolated from the inlet air flow to mix with the inlet air flow downstream of the upstream heat-producing component.

According to one embodiment, configuring a computer system to direct a bypass air flow to bypass from flowing in heat transfer communication with a heat-producing component installed in the computer system interior and to mix with a separate inlet air flow in a portion of the computer system interior that is downstream of the heat-producing component in the computer system interior includes partitioning the upstream portion of the interior into separate air passages, where one passage directs the inlet air flow to remove heat from the heat-producing component and another separate passage directs a bypass air flow to mix with the inlet air flow in the portion of the computer system interior that is downstream of the at least one heat-producing component in the computer system interior. The separate air passage is unencompassed by the particular air passage that directs the inlet air flow.

According to one embodiment, a system for storing data includes a rack, multiple computer systems mounted on the rack, and at least one bypass air plenum that extends through a gap space between two adjacent computer systems. The computer systems include a chassis with an inlet and outlet end that encompasses an interior, a circuit board in an upstream portion of the interior and includes an upstream heat-producing component on an upper surface, and an inlet air plenum that extends through the interior above the circuit board and directs an inlet air flow that removes heat from the upstream heat-producing component. The bypass air plenum is unencompassed by the chassis interior of either of the adjacent computer systems and directs a bypass air flow that is isolated from the inlet air flow to mix with the inlet air flow in the inlet air plenum of one of the adjacent computer systems downstream of the upstream heat-producing component to establish a mixed air flow.

According to one embodiment, a computer system includes a chassis, having an inlet end, which at least partially encompasses a chassis interior, and inlet air plenum, and a bypass air vent. The chassis at least partially bounds, on an external surface of at least one end that is separate from the inlet end, a gap space external to the chassis interior. The inlet air plenum directs an inlet air flow from the inlet end through an upstream portion of the chassis interior to remove heat from an upstream heat-producing component installed in the upstream portion of the chassis interior. The bypass air vent is included in the at least one end that is separate from the inlet end. The bypass air vent receives a bypass airflow from a portion of the gap space to mix with the inlet air flow in a location in the chassis interior that is downstream of the upstream heat-producing component.

According to one embodiment, configuring a computer system to direct a bypass air flow of air that bypasses flowing in heat transfer communication with at least one heat-producing component installed in an interior of the computer system to mix with a separate inlet air flow in a portion of the computer system interior that is downstream of the at least one heat-producing component in the computer system interior comprises installing a bypass air vent in an end of the chassis and mounting at least one structural element to establishing a gap space external to the computer system. The end of the chassis in which the bypass air vent is installed is downstream of the at least one heat-producing component in the computer system interior. The bypass air vent is in flow communication with an external environment. The at least one structural element is mounted proximate to an outer surface of the end of the chassis. The gap space is at least partially encompassed by the outer surface of the end of the chassis and the at least one structural element. The bypass air vent directs the bypass air flow from the gap space into the chassis interior to mix with the inlet air flow in the portion of the computer system interior that is downstream of the at least one heat-producing component in the computer system interior.

As used herein, "air moving device" includes any device, element, system, or combination thereof that can move air. Examples of air moving devices include fans, blowers, and compressed air systems.

As used herein, "backplane" means a plate or board to which other electronic components, such as mass storage devices, circuit boards, can be mounted. In some embodiments, mass storage devices, which can include one or more hard disk drives, are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials. A circuit board can include a printed circuit board.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

FIG. 1A is a schematic diagram illustrating a perspective view of a computer system that includes heat-producing components installed in upstream portions and downstream portions of the computer system chassis interior and an airflow through the interior, according to some embodiments. FIG. 1B is a schematic diagram illustrating a side view of the computer system. FIG. 1C is a graphical representation of a temperature profile of an airflow through the computer system interior that removes heat from heat-producing components installed in the upstream portion and heat-producing components installed in the downstream portion, according to some embodiments.

Computer system 100 includes a chassis 108 that at least partially encompasses a chassis interior 101, upstream heat-producing components 122, supported by a circuit board 120, that are coupled to the chassis 108 in an upstream portion of the interior 101, downstream heat-producing components 134 coupled to the chassis 108 in a downstream portion 104 of the interior, and an array 106 of air moving devices 107 coupled to the chassis in the chassis interior 101. Chassis 108 includes at least a base plate 110 and an inlet plate 112. Components coupled to the chassis in a portion of the chassis interior can include components that are installed in the chassis interior, and installing a component in the chassis interior can include coupling the component to a portion of the chassis, such that the component is mounted in a particular position in the chassis interior.

In some embodiments, components mounted in a particular position in the chassis interior may partition a portion of the chassis interior into various interior spaces, which can include one or more air plenums through which air is directed to cool heat-producing components in the chassis interior. In the illustrated embodiment, for example, circuit board 120 is installed in an elevated position in an upstream portion of the chassis interior 101, where the upstream portion comprises a portion of the interior 101 that is proximate to the inlet end 180 of the chassis. As a result of installing the circuit board 120 in the elevated position, the upstream portion of the interior 101 is partitioned into an inlet air plenum 102, through which cooling air received into the plenum 102 as "inlet air" flows to cool various heat-producing components in the interior 101, and a space 129 is established between the lower surface of the circuit board 120 and an upper surface of the base plate 110 of the chassis 108.

The space 129 established between the circuit board 120 and the base plate 110 can mitigate contact by the base plate 110 with various elements that may protrude from the lower surface of the circuit board 120, including capacitor elements, stiffening brackets under a central processing unit, connector tails soldered to the circuit board 120 that protrude through the lower surface, some combination thereof, or the like. The spacing 129 between the circuit board 120 and the base plate 110 can mitigate the risk of electrical shorting of the circuit board 120 via contact with the base plate 110.

In some embodiments, portions of the chassis interior are partitioned based at least in part upon various components coupling with various portions of the chassis to establish interior spaces that are bounded by the components and portions of the chassis. In the illustrated embodiment, for example, the circuit board 120 is coupled to inlet plate 112 of the chassis 108. In some embodiments, the circuit board is coupled at least partially to the base plate 110 and rests upon one or more vertical posts that support the circuit board 120 in an elevated position above space 129.

In some embodiments, a computer system includes an inlet end that is configured to face into an aisle space when the computer system is mounted in a rack. The aisle space can include a cold aisle that supplies cooling air into the computer system to remove waste heat from heat-producing components in the computer system interior. The cooling air can enter the computer system interior, which can include a chassis interior 101, via one or more inlet air vents installed in an inlet end of the computer system. In the illustrated embodiment, for example, chassis 108 includes an inlet plate 112 at the inlet end 180 of the computer system 100, where the inlet plate 112 includes inlet vents 114 through which cooling air passes into the interior 101. Such cooling air, referred to hereinafter as an "inlet air flow" 116, can flow through the various portions of the interior 101 that are in flow communication with the inlet vents 114 and remove heat from the various heat-producing components installed in positions that are in heat transfer communication with the air flow 116. For example, as plenum 102 is established via the upper surface of circuit board 120 and portions of the inlet plate 112 that include the air vents 114, the air flow 116 directed into the plenum 102 via air vents 114 can remove heat from upstream heat-producing components 118, 122, which can each include one or more heat-producing components, installed in heat transfer communication with the plenum 102.

A component in heat transfer communication with an air plenum can include a component which is installed in a position that exposes one or more portions of the component to an air flow through the air plenum, such that the air flow can remove heat from the component. In some embodiments, a component in heat transfer communication with an air plenum includes a component that is at least partially installed within a portion of the air plenum through which the air flow is directed.

Air moving device 107 can supply the inlet airflow 116 that has passed through the inlet air plenum 102, via ducting 111 and fans 109, to a downstream portion 104 of the interior 101 in which downstream heat-producing components 134, which can include mass storage devices, are installed. A heat-producing component may be referred to as an "upstream heat-producing component" or "downstream heat-producing component" based at least in part upon the heat-producing component being coupled to the chassis within the upstream portion or downstream portion of the chassis interior, respectively.

As the space 129 is not in flow communication with an air vent 114, the air in space 129 can be stagnant. In the illustrated embodiment, for example, space 129 is established by base plate 110, the lower surface of circuit board 120, and a portion of inlet plate 112 that does not include inlet air vents 114. As a result, space 129 may be unencompassed by, and isolated from, the plenum 102 and the airflow 116 passing through it.

In some embodiments, as the inlet air flow 116 passes from the inlet end 180 towards the exhaust end 190 and removes heat from heat-producing components coupled to the chassis in various portions of the chassis interior 101, the inlet air flow 116 progressively increases in temperature and loses heat removal capacity. FIG. 1C shows a graph 139 of a relationship 150 between the temperature 140 of the inlet air flow 116 and the distance 142 through which the air flow 116 passes in the chassis interior 101 illustrated in FIG. 1A-B. As shown in FIG. 1C, the inlet air flow 116 entering the chassis interior 101 at the inlet end 180, also illustrated as point X=0, has a temperature 145 that corresponds to the temperature of the cooling air external to the computer system 100. As the inlet air flow 116 passes through the inlet air plenum 102 that is proximate to the inlet end 180, the inlet air flow 116 removes heat from one or more heat-producing components included in upstream heat-producing components 118, 122 installed in heat transfer communication with the plenum 102. As further shown in the graph 139 of FIG. 1C, as the inlet air flow 116 removes heat from upstream heat-producing components 118, 122, the temperature 140 of the air flow 116 rises, so that the temperature of the airflow 116 at a location "X1" along the distance 142 through the interior 101, where X1 is a location in the interior 101 that is downstream of the upstream heat-producing components 118, 122, is at a temperature 152 that is elevated over the initial temperature 145 of the air flow 116. The rise in temperature can be due to the air flow 116 removing heat from upstream heat-producing components 118, 122.

As the air flow 116 passes through the air moving device 107 and into the downstream portion 104 of the chassis interior 101, the air flow 116 removes heat from various downstream heat-producing components 134 installed in the downstream portion 104. As a result, as shown in FIG. 1C, the temperature of the air flow 116 continues to increase as it passes across the heat-producing components 134, to temperature 154 at location "X2" and to temperature 156 at location "X3" downstream of the heat-producing components 134 proximate to the exhaust end 190.

In some embodiments, various components installed in the computer system interior 101 have various maximum operating temperature thresholds. A maximum operating temperature threshold can include a maximum operating temperature of the component, above which the component may incur damage due to heat. In some embodiments, components to be installed in the chassis interior that have lower maximum temperatures, also referred to as components with relatively greater heat sensitivity, than other components to be installed in the chassis interior can be mounted proximate to the inlet end 180, so that the inlet air flow 116 across those components has a lower temperature and greater heat removal capacity relative to the air flow passing through the downstream portion of the chassis interior. As a result, the components installed in the upstream portion of the computer system can operate at a lower temperature than components installed in the downstream portion.

In some embodiments, certain components are installed in the upstream portion of the chassis interior despite having lower heat sensitivities than components installed in the downstream portion. For example, in the illustrated embodiment of FIG. 1B, computer system 100 includes an I/O slot card 118 and circuit board 120 supporting upstream heat-producing component 122, where upstream heat-producing component 122 can include a central processing unit (CPU). The illustrated configuration of components in the upstream portion, in some embodiments, enables certain connections to the computer system 100 on the inlet end 180, including power connections, communication connections, etc.

However, as illustrated in FIG. 1C, the upstream heat-producing component 122 installed in the upstream portion, which can include a CPU, has a maximum operating temperature 144 that is higher than the maximum operating temperature 146 of the downstream heat-producing components 134, which can include mass storage devices, installed in the downstream portion 104. Because the CPU 122 is installed in the upstream portion, the operating temperature 152 of the CPU can be significantly less than the maximum operating temperature for that heat-producing component, as illustrated by margin 162, based at least in part upon the lower temperature of the inlet air flow 116 in the plenum 102 and the higher maximum operating temperature 144 of the CPU 122.

In contrast, because the mass storage devices 134 have a lower maximum operating temperature 146, and the devices 134 are installed in the downstream portion 104, the inlet air flow 116 that flows across the devices 134 has already removed heat from the CPU 122 and thus already has an elevated temperature and reduced heat removal capacity relative to the inlet air flow that initially enters through the inlet end at X=0. The resulting operating temperatures 154, 156 of the devices 134 can be relatively close to the maximum operating temperature 146, with minimal temperature margin 164, 166 between the operating temperatures and the maximum operating temperature to avoid thermal damage.

In some embodiments, air flow through a computer system is controlled to be optimized against the maximum operating temperatures of the components installed therein. Optimized airflow can include an airflow that maintains an operating temperature of some or all of the components installed in the computer system approximately at their maximum operating temperatures. As a result, a given component receives a sufficient airflow at a sufficiently low temperature to avoid thermal damage, without expending excess airflow across other components.

However, where components with high heat sensitivity are installed in a downstream portion of a computer system, excess airflow may be supplied through the computer system to ensure that the downstream heat-producing components do not incur damage. In the illustrated embodiment of FIG. 1C, for example, while just enough inlet air flow 116 is supplied through the interior 101 to maintain the operating temperature 156 of the exhaust end-proximate mass storage device 134 with a minimal margin 166 beneath the maximum operating temperature 146, and the preceding device 134 operates at a similar temperature 154 with slightly more margin 164, the CPU 122 operates at a temperature 152 that is significantly less than the maximum operating temperature 144 for that heat-producing component, as shown by margin 162. Such a significant temperature margin 162 indicates that excess air is being passed across CPU 122 in order to ensure that the mass storage devices 134 receive sufficient cooling.

Furthermore, while the rate of inlet air flow 116 is controlled by operation of the air moving devices 107 in the computer system interior 101, and the devices 107 can adjust the inlet air flow 116 through the entire interior 101 by adjusting operating speed, such adjustment equally affects flow rate across upstream heat-producing components 118, 122 and downstream heat-producing components 134. As a result, increasing the air flow 116 to provide sufficient cooling to downstream heat-producing components 134 provides excess air flow 116 to upstream heat-producing components 122, while reducing air flow 116 to optimize air flow across upstream heat-producing components 122 can starve the downstream heat-producing components 134 from receiving sufficient cooling to prevent thermal damage.

Figures 2A, 2B:
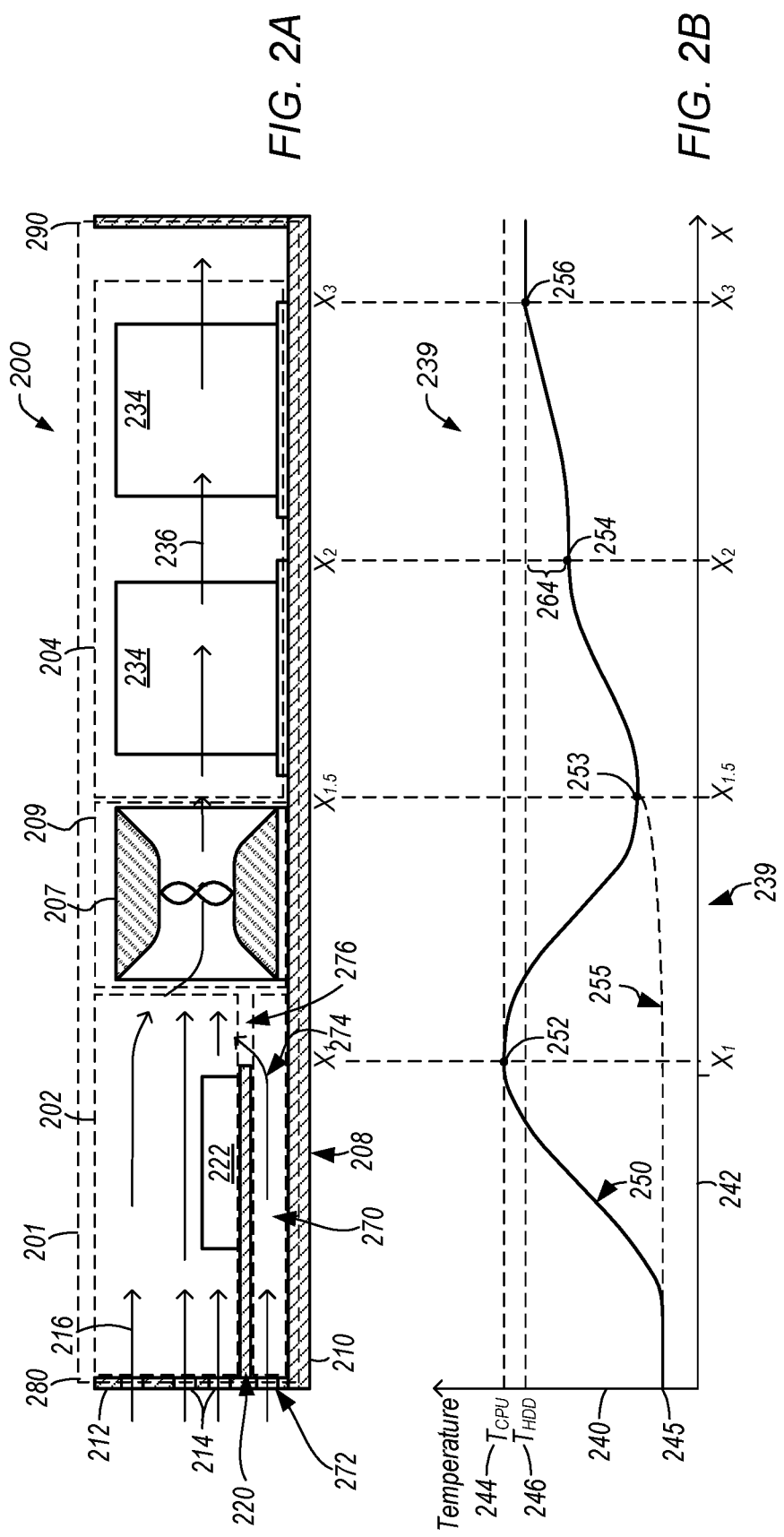
FIG. 2A is a schematic diagram illustrating a side view of a computer system that includes a bypass air plenum, according to some embodiments.
FIG. 2B is a graphical representation of a temperature profile of an inlet airflow through a computer system chassis interior that removes heat from heat-producing components installed in an upstream portion of the chassis interior, mixes with a bypass airflow downstream of the upstream heat-producing components, and removes heat from heat-producing components installed in a downstream portion of the chassis interior, according to some embodiments.

FIG. 2A is a schematic diagram illustrating a side view of a computer system that includes heat-producing components installed in upstream portions and downstream portions of the computer system chassis interior and a bypass air plenum that extends beneath a circuit board and directs a bypass airflow to mix with an inlet airflow downstream of an upstream heat-producing component installed in the upstream portion of the computer system chassis interior, according to some embodiments. FIG. 2B is a graphical representation of a temperature profile of an inlet airflow through the chassis interior that removes heat from upstream heat-producing components installed in an upstream portion of the chassis interior, mixes with a bypass airflow downstream of the upstream heat-producing components, and removes heat from downstream heat-producing components installed in a downstream portion of the chassis interior, according to some embodiments.

Computer system 200 includes a chassis 208 that at least partially encompasses a chassis interior 201, upstream heat-producing components 222 supported by a circuit board 220 installed in an upstream portion of the interior 201, downstream heat-producing components 234 installed in a downstream portion 204 of the interior 201, and an air moving device 207 installed in the interior 201. Chassis 208 includes at least a base plate 210 and an inlet plate 212.

In some embodiments, a bypass air plenum directs a bypass air flow that is isolated from the inlet air flow to mix with the inlet air flow downstream of one or more heat-producing components from which the inlet air flow has removed heat. The bypass air flow mixes with the heated inlet air flow to provide a mixed air flow that is cooler than the heated inlet air flow. The mixed air flow can cool components installed in a downstream portion of the computer system.

In the illustrated embodiment, computer system 200 includes a bypass air plenum 270 that extends beneath the circuit board 220 in the upstream portion of the interior 201. The plenum 270 can be at least partially established by a portion of the circuit board 220, including a lower surface of the circuit board 220, and a portion of the base plate 210. Bypass air vent 272 supplies cooling air into the plenum 270 as a bypass air flow 274. In some embodiments, bypass air plenum 270 is established by installing bypass air vent 272 in a computer system that includes a space beneath an installed circuit board, such as illustrated and discussed above with reference to space 129 of computer system 100 in FIG. 1A-B. The bypass air vent 272 enables air flow through the space that comprises the plenum 270.

In some embodiments, the plenum 270 is unencompassed by the inlet air plenum 202 through which an inlet air flow 216 is directed to remove heat from one or more heat-producing components included in one or more upstream heat-producing components 222 installed in the upstream portion of the computer system interior 201. In the illustrated embodiment, for example, plenum 270 does not extend through plenum 202 via ducting, but is rather isolated from the plenum 202 via the circuit board 220. Heat transfer through circuit board 220 to the bypass air flow 274 from heat-producing components 222 may be significantly less than heat transfer from components 222 to inlet air flow 216. As a result, the bypass air flow 274 may reach a point in the interior 201 that is downstream from components 222 with a reduced temperature and greater heat removal capacity than the inlet air flow 216 that has reached the same point downstream of components 222. Inlet air that has passed in heat transfer communication with one or more upstream heat-producing components, and has removed heat from same, is referred to hereinafter as "heated inlet air".

In some embodiments, a bypass air flow is directed, via a bypass air plenum, to mix with heated inlet air to provide a mixed air flow that is cooler than the heated inlet air. The bypass air flow can be directed into the inlet air plenum 202, for example, at a location in the plenum 202 that is downstream of one or more upstream heat-producing components 222. The bypass air flow can be directed into the inlet air plenum via a gap between various components in the computer system that allows a portion of the inlet air plenum to receive a bypass air flow from the bypass air plenum. In the illustrated embodiment, for example, a gap 276 between circuit board 220 and air moving device 207 enables the bypass air flow 274 to flow from plenum 270 into plenum 202 at a point downstream of the heat-producing components 222, such that the bypass air flow 274 does not flow in heat transfer communication with the heat-producing components 222 and does not remove heat from the heat-producing components 222 due to such flow. In some embodiments, the bypass air flow 274 and the heated inlet air flow 216 can mix at a point downstream of each of the plenums 202, 270. For example, the air flows 216, 274 can mix in a midstream portion 209 of the interior 201, which may include one or more air moving devices 207. In some embodiments, the operation of the air moving device 207 facilitates mixing of the air flows 216, 214 in the midstream portion 209. For example, air moving device 207 can at least partially induce the bypass air flow 274 and inlet air flow 216 and, by drawing both air flows 216, 270 through the air moving device 207, facilitates mixing of the separate air flows.

In some embodiments, the mixed air flow provided by the mixing of a bypass air flow and a heated inlet air flow is directed through a downstream portion of the chassis interior to cool various downstream heat-producing components installed in the downstream portion. In the illustrated embodiment of FIG. 2A, for example, mixed air flow 236 flows from midstream portion 209 and through downstream portion 204 to remove heat from downstream heat-producing components 234 installed in the downstream portion. Downstream heat-producing components 234 can include mass storage devices, including hard disk drives (HDDs).

In some embodiments, mixing the inlet air flow with the bypass air flow at a point downstream of at least one upstream heat-producing component provides a mixed air flow that has a greater heat removal capacity and lower temperature than the inlet air flow alone downstream of the upstream heat-producing component. For example, as the inlet air flow 216 passes from the inlet end 280 towards the exhaust end 290 and removes heat from heat-producing components 222 installed in the inlet air plenum 202, the inlet air flow 216 progressively increases in temperature and loses heat removal capacity. FIG. 2B shows graph 139 of a relationship 250 between the temperature 240 of the inlet air flow 216 and the distance 242 through which the air flow 216 passes in the computer system 200 illustrated in FIG. 2A. As shown in FIG. 2B, the inlet air flow 216 entering the computer system 200 at the inlet end 280, also referred to as point X=0, has a temperature 245 that corresponds to the temperature of the cooling air external to the computer system 200. As the inlet air flow 216 passes through the plenum 202 that is proximate to the inlet end 280, the inlet air flow 216 removes heat from one or more heat-producing components 222 installed in heat transfer communication with the plenum 202. As further shown in the graph 239 of FIG. 2B, as the inlet air flow 216 removes heat from heat-producing components 222, the temperature 240 of the air flow 216 rises, so that the temperature of the airflow 216 at a location "X1" along the distance 242 through the interior 201, where X1 is a location that is downstream of the heat-producing components 222, is at a temperature 252 that is elevated over the initial temperature 245 of the air flow 216. The rise in temperature can be due to heat removal from heat-producing components 222.

FIG. 2B further illustrates a relationship 255 between the temperature 240 of the bypass air flow 274 and the distance 242 through the interior 201. The illustrated relationship 255 shows that a bypass air flow 274 through the bypass air plenum 270 maintains an air temperature that approximates the initial temperature 245 of the cooling air, as the bypass air flow 274 bypasses from removing heat from heat-producing components 222 in the inlet air plenum 202.

As the air flows 216 and 274 pass downstream of the upstream heat-producing components 222, the bypass air flow 274 can be directed, via a gap 276 between surfaces establishing the plenum 270, via directing by one or more elements through a midstream portion 209, etc., to mix with the inlet air flow 216. As a result, as shown in FIG. 2B, the characteristics of the two air flows mix to provide characteristics of the mixed air flow 236. As the mixed air flows pass through the midstream portion 209, from location "X1" to "X1.5", the temperature of the mixed air flow 236 reaches a point 253 that is less than the temperature point 252 of the inlet air flow 216 after removing heat from heat-producing components 222 and prior to mixing and is more than the approximate temperature point 245 of the bypass air flow 274. As shown, the mixed air flow 236 may have a greater heat removal capacity and lower temperature than the heated inlet air flow 216 alone.

As the mixed air flow 236 passes through the downstream portion 204 of the computer system interior 201, the air flow 236 removes heat from various downstream heat-producing components 234 installed in the downstream portion 204. As a result, as shown in FIG. 2B, the temperature of the air flow 236 increases as it passes across the heat-producing components 234, to temperature 254 at location "X2" and to temperature 256 at location "X3" downstream of the downstream heat-producing components 234 proximate to the exhaust end 290.

In some embodiments, air flow through a computer system that includes a bypass air plenum enables at least some heat-producing components in both upstream and downstream portions of the chassis interior to operate approximately at the respective maximum operating temperatures for the respective components, regardless of whether the downstream heat-producing components have greater heat sensitivity than the upstream heat-producing components. In the illustrated embodiment, where the downstream heat-producing components 234 have a lower maximum operating temperature 246 than the maximum operating temperature 244 of the upstream heat-producing components 222 by a certain margin 264, the mixed air flow 236 has sufficiently flow and sufficiently reduced temperature to maintain the most exhaust-proximate heat-producing component 234 at a temperature 256 that approximates the maximum operating temperature 246 for that heat-producing component. A temperature of a component may be considered to approximate the maximum operating temperature when the temperature is less than the maximum operating temperature by no more than a certain temperature margin. As a result, air flow is optimized for that heat-producing component 234.

Furthermore, as shown in FIG. 2B, the inlet air flow 216 entering plenum 202 via inlet end 280 is of sufficient flow rate and sufficiently low temperature 245 to maintain heat-producing components 222 at a temperature 252 that approximates the maximum operating temperature 244 for that heat-producing components 222. As a result, air flow is optimized for those heat-producing components 222 as well. Thus, the air flow 216 through plenum 202 is optimized for heat removal from heat-producing components 222, while the bypass airflow 274 enables optimizing of the airflow 236 through downstream portion 204 for heat removal from downstream heat-producing components 234, thereby optimizing the airflow through the entire computer system 200. Excess air flow through computer system 200 is minimized, such that, while some components may operate at a small margin 264 below the maximum operating temperature 246 for that respective component, the combined inlet airflow 216 and bypass airflow 270 is minimally sufficient to preclude thermal damage to components in both the upstream portion and the downstream portion of the computer system. In some embodiments, an optimized combined inlet air flow 216 and bypass airflow 270 enable maximization of the number of heat-producing components 222, 234 in the computer system that are operating approximately at their respective maximum operating temperatures.

Figure 3:
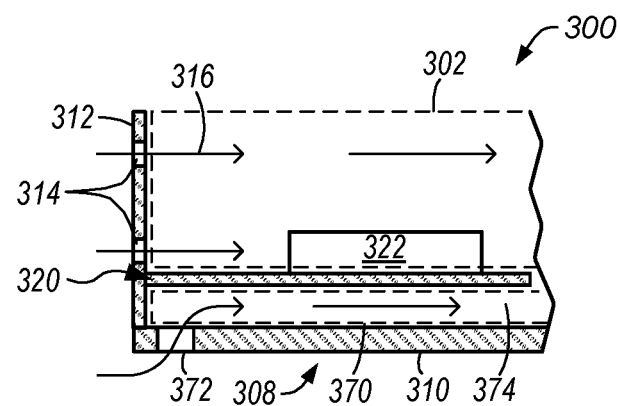
FIG. 3 is a schematic diagram illustrating a side view of an upstream portion of a computer system chassis interior that includes a bottom vent supplying air to the bypass air plenum, according to some embodiments.

FIG. 3 is a schematic diagram illustrating a side view of an upstream portion of a computer system interior that includes a bottom vent supplying air to the bypass air plenum, according to some embodiments. Computer system 300 includes a chassis 308 that includes a base plate 310 and an inlet plate 312, a circuit board 320 supporting a heat-producing component 322 in heat transfer communication with an inlet air plenum 302, and a bypass air plenum 370 extending beneath at least a portion of the circuit board 320. In some embodiments, computer system 300 is at least partially comprised in at least computer system 200, illustrated and described above with reference to FIG. 2A-B.

In some embodiments, a bypass air vent can be established in various faces of a bypass air plenum. The bypass air vent may be established in a portion of a chassis that is separate from another portion of the chassis in which one or more inlet air vents are established. For example, in the illustrated embodiment, the computer system 300 includes a bypass air plenum 370, established between a chassis base plate 310, inlet plate 312, and circuit board 320, that receives a bypass air flow 374 via a bypass air vent 372 that is established in the base plate 310, rather than the inlet plate 312 in which the inlet air vents 314 that supply the inlet air flow 316 to the inlet air plenum 302 are established. In some embodiments, where the computer system 300 is stacked vertically adjacent to one or more external components, the bypass air vent 372 can supply air into the plenum 370 from a gap between the computer system 300 and an external component mounted beneath the computer system 300.

In some embodiments, bypass air vent 372 supplies bypass air flow 374 from a separate air source than the source from which inlet air vents 314 supply inlet air flow 316. For example, the inlet air flow 316 may be directed into plenum 302 from a cold aisle that is faced by inlet plate 312, where the cold aisle circulates ambient air received into the cold air from a free-cooling system, while the bypass air flow 374 may be directed through bypass air vent 372 from a mechanical cooling system that sensibly chills the bypass air flow. In some embodiments, the bypass air flow 374 is supplied into plenum 370 via a conduit that couples with the bypass air vent 372.

Figure 4:
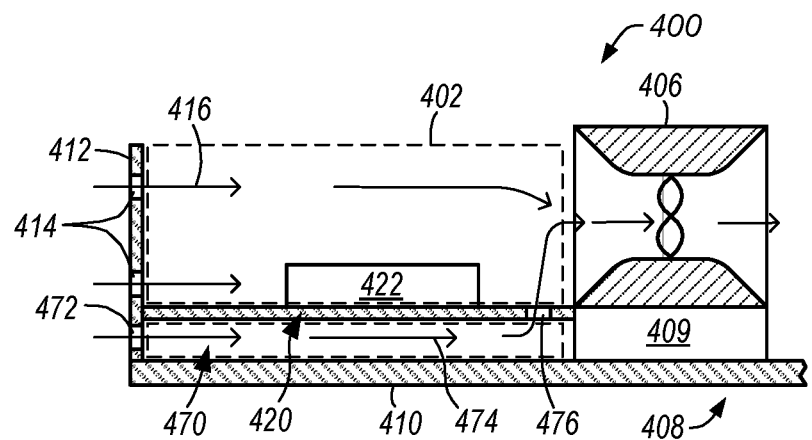
FIG. 4 is a schematic diagram illustrating a side view of an upstream portion of a computer system chassis interior that includes a discharge vent that discharges bypass air from a bypass air plenum to mix with the inlet airflow, according to some embodiments.

FIG. 4 is a schematic diagram illustrating a side view of an upstream portion of a computer system chassis interior that includes a discharge vent that discharges bypass air from a bypass air plenum to mix with the inlet air flow, according to some embodiments. Computer system 400 includes a chassis 408 including a base plate 410 and an inlet plate 412, a circuit board 420 supporting an upstream heat-producing component 422 in heat transfer communication with an inlet air plenum 402, and a bypass air plenum 470 extending beneath at least a portion of the circuit board 420. In some embodiments, computer system 400 is at least partially comprised in at least computer system 200, illustrated and described above with reference to FIG. 2A-B.

In some embodiments, a discharge air vent can be established in one or more portions of a component that establishes at least one boundary of the bypass air plenum. Where a boundary of the bypass air plenum is established by a circuit board, for example, a discharge air vent can be established in the circuit board. The discharge air vent enables a bypass air flow to pass through the circuit board, from the bypass air plenum extending along one surface of the circuit board, to mix with an inlet air flow in a space that is bounded by the opposite surface of the circuit board.

For example, in the illustrated embodiment of FIG. 4, where air moving device 406 is mounted on a structure 409 in physical contact with circuit board 420 to establish the boundaries of bypass air plenum 470 that are not established by plates 410, 412 of the chassis, circuit board 420 can include a discharge vent 476 that communicatively couples the bypass air plenum 470 with the inlet air plenum 402 at a point in the plenum 402 downstream of at least one heat-producing component 422 installed in heat transfer communication with the plenum 402. As a result, bypass air 474 passing through the bypass air plenum 470 from the bypass air vent 472 can be discharged from the bypass air plenum into the inlet air plenum 402 via one or more discharge vents 476 established in the circuit board 420.

Figure 5A:
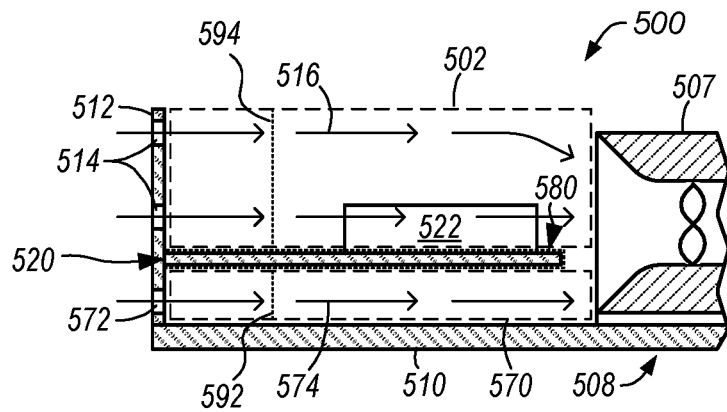
FIG. 5A-C are schematic diagrams illustrating side views of an upstream portion of a computer system chassis interior that includes a component that can be installed in various elevations in the interior to control the cross-sectional areas of the bypass air plenum and the inlet air plenum, according to some embodiments.
Figure 5B:
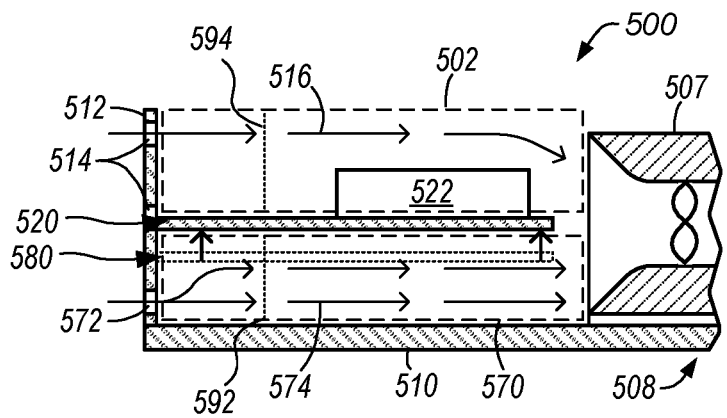
Figure 5C:
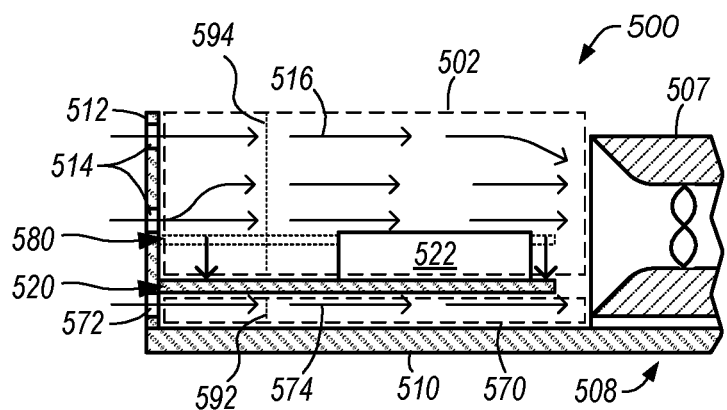

FIG. 5A-C are schematic diagrams illustrating side views of an upstream portion of a computer system chassis interior that includes a component that can be installed in various elevations in the interior to control the cross-sectional areas of the bypass air plenum and the inlet air plenum, according to some embodiments. Computer system 500 includes a chassis 508 that includes a base plate 510 and inlet plate 512, a circuit board 520 supporting an upstream heat-producing component 522 in heat transfer communication with an inlet air plenum 502, a bypass air plenum 570 extending beneath the circuit board 520, and an air moving device 507 that induces the inlet air flow 516 and bypass air flow 574 through at least the respective air plenums 502, 570. In some embodiments, computer system 500 is at least partially comprised in at least computer system 200, illustrated and described above with reference to FIG. 2A-B.

In some embodiments, one or more components in a computer system can be adjustably configured to be installed in the chassis interior in various positions to provide adjustable control of the relative flow rates of the inlet air flow and the bypass air flow through the computer system interior. Such one or more components can be referred to as flow control elements, and can be installed in the interior in various positions to provide variable cross-sectional areas of the inlet air plenum and bypass air plenum. A cross-sectional area of a plenum can refer to a cross-section of a plenum that extends perpendicular to the direction of air flow through the plenum. In some embodiments, a cross-sectional area of a plenum influences the rate of airflow, including a volumetric flow rate, mass flow rate, etc., that can be induced through the plenum. For example, increasing a cross-sectional area of the plenum can increase the airflow that can be induced through the plenum, and reducing the cross-sectional area of the plenum can decrease the airflow that can be induced through the plenum.

In some embodiments, one or more components can be installed in an interior of the chassis 508 in one or more various positions to enable various cross-sectional areas of the inlet air plenum and the bypass air plenum. The components can be installed in various positions to implement complementary changes to each of the inlet air plenum and bypass air plenum cross-sectional areas, where an increase in the cross-sectional area of the bypass air plenum corresponds with a decrease in the cross-sectional area of the inlet air plenum, and vice versa. In some embodiments, the one or more components can include a circuit board supporting one or more upstream heat-producing components, where the circuit board partitions a portion of the chassis interior to establish respective boundaries of the inlet air plenum and bypass air plenum. One or more of the chassis and the circuit board can be configured to install the circuit board in various positions in the chassis interior, such that various relative cross-sectional areas of the inlet air plenum and bypass air plenum are established.

Installing the circuit board in different positions in the chassis interior can enable different relative air flows through the inlet air plenum and bypass air plenum, which can enable different rates of cooling of various heat-producing components installed in the computer system and, therefore, different operating temperatures of the various components. For example, FIG. 5A-C shows that a circuit board 520 that supports a heat-producing component 522 in an inlet air plenum 502 of the computer system 500 can be installed, via coupling to inlet plate 512 of the chassis 508, in various positions that correspond to various elevations above the base plate 510 of the chassis 508. The position at which the circuit board 520 is coupled to the inlet plate 512 can establish the respective cross-sectional areas 592, 594 of the bypass air plenum 570 and the inlet air plenum 502, which can establish the relative rates of flow of the respective bypass air flow 574 and inlet air flow 516.

FIG. 5A illustrates the circuit board 520 being coupled to inlet plate 512 at a particular position 580 in the upstream portion of the chassis interior. Because the opposite surfaces of circuit board 520 establish respective boundaries of the inlet air plenum 502 and bypass air plenum 570, circuit board 520 establishes at least a portion of the respective cross-sectional areas 594, 592 of the respective air plenums 502, 570.

As shown in FIG. 5B, circuit board 520 can be coupled to inlet plate 512 in a position that is elevated relative to the particular position 580 at which the circuit board 520 is coupled to inlet plate 512 in FIG. 5A. As a result, because the circuit board 520 is installed in an elevated position, the space beneath the circuit board that comprises the bypass air plenum 570 in FIG. 5B is increased in volume relative to FIG. 5A. In addition, the cross-sectional area 592 of the bypass air plenum is increased. As a result, the flow rate of the bypass airflow 574 through the bypass air plenum 570 in FIG. 5B can be greater than the bypass airflow 574 through the bypass air plenum 570 in FIG. 5A. Furthermore, because the upper surface of circuit board 520 establishes a lower boundary of the inlet air plenum 502, the elevated installed position of the circuit board 520 in FIG. 5B results in an inlet air plenum 502 with a reduced volume relative to FIG. 5A. In addition, the cross-sectional area 594 of the inlet air plenum 502 is reduced. As a result, the flow rate of the inlet airflow 516 through the inlet air plenum 502 in FIG. 5B can be less than the inlet airflow 516 through the inlet air plenum 502 in FIG. 5A.

As shown in FIG. 5C, circuit board 520 can be coupled to inlet plate 512 in an installed position that is lowered relative to the particular position 580 at which the circuit board 520 is coupled to inlet plate 512 in FIG. 5A. As a result, because the circuit board 520 is in a lowered position, the space beneath the circuit board that comprises the bypass air plenum 570 is decreased in volume relative to FIG. 5A. In addition, the cross-sectional area 592 of the bypass air plenum 570 is decreased. As a result, the flow rate of the bypass airflow 574 through the bypass air plenum 570 in FIG. 5B can be less than the bypass airflow 574 through the bypass air plenum 570 in FIG. 5A. Furthermore, because the upper surface of circuit board 520 establishes a lower boundary of the inlet air plenum 502, the lowered installed position of the circuit board 520 in FIG. 5B relative to the position 580 in FIG. 5A results in an inlet air plenum 502 with an increased volume. In addition, the cross-sectional area 594 of the inlet air plenum 502 is increased. As a result, the flow rate of the inlet airflow 516 through the inlet air plenum 502 in FIG. 5B can be greater than the inlet airflow 516 through the inlet air plenum 502 in FIG. 5A.

In some embodiments, where the circuit board 520 couples to the inlet plate 512, and where the inlet plate includes air vents 514, 572 that can supply air to one or more of the separate plenums, the particular position at which circuit board 520 is installed in the computer system 500 can determine whether an air vent in the inlet plate 512 is an inlet air vent 514 that directs air into the inlet air plenum 502 or a bypass air vent 572 that directs air into the bypass air plenum 570. Coupling the circuit board 520 to the inlet plate 512 at a position that is above an air vent 514 may put the air vent in flow communication with the bypass air plenum 570 and partition the air vent from being in flow communication with the inlet air plenum 502, thereby rendering the air vent as a bypass air vent 572. Conversely, coupling the circuit board 520 to the inlet plate 512 at a position that is below an air vent 514 may put the air vent in flow communication with the inlet air plenum 502 and partition the air vent from being in flow communication with the bypass air plenum 570, thereby rendering the air vent as an inlet air vent. In some embodiments, one or more components, including a circuit board 520, can be coupled to the inlet plate 512 to partition a portion of a vent in the inlet plate 512 between directing air to one plenum 502 and directing air to another plenum 570. In some embodiments, including the embodiment illustrated in FIG. 5B, the circuit board 520 can be coupled to the inlet plate 512 at a position that at least partially obstructs an air vent.

Because the circuit board 520 establishes boundaries of both the inlet air plenum 502 and the bypass air plenum 570, installing the circuit board 520 in the computer system 500 in various different positions can facilitate complementary changes in the cross-sectional areas of both plenums. For example, as shown in FIG. 5B, installing the circuit board 520 in an elevated position both increases the cross-sectional area 592 of the bypass air plenum 570 and decreases the cross-sectional area 594 of the inlet air plenum 502, thereby enabling bypass air flow 574 to be increased while inlet air flow 516 is decreased. Similarly, as shown in FIG. 5C, installing the circuit board 520 in a lowered position both decreases the cross-sectional area 592 of the bypass air plenum 570 and increases the cross-sectional area 594 of the inlet air plenum 502, thereby enabling bypass air flow 574 to be reduced while inlet air flow 516 is increased.

Because the flow rate of inlet air flow 516 can affect the cooling of heat-producing components 522 installed in heat transfer communication with the inlet air plenum, and the flow rate of bypass air flow 574 can affect the cooling of heat-producing components installed in a downstream portion (not shown in FIG. 5A-C) of the chassis interior, installing the circuit board 520 in various positions can result in adjusting the rate of cooling of heat-producing components in both upstream and downstream portions of the chassis interior. For example, installing the circuit board 520 in the elevated position shown in FIG. 5B can result in increased cooling of heat-producing components installed in a downstream portion of the computer system, as more bypass air that does not remove heat from one or more upstream heat-producing components is directed to mix with the inlet air flow, resulting in a mixed air flow that has more heat removal capacity, while also resulting in reduced cooling of heat-producing components 522 installed in heat transfer communication with the inlet air plenum 502. Converse results can be achieved through installing the circuit board 520 in a lowered position as shown in FIG. 5C. As a result, the circuit board 520 can be installed in various positions to implement complementary control of the cooling of upstream and downstream heat-producing components.

In some embodiments, the installing of a circuit board 520 at one of various positions, as shown in FIG. 5A-C, can be implemented during coupling of the circuit board 520 to the chassis 508, for example during manufacturing, assembly, etc. of some or all of the computer system 500. The particular position at which the circuit board 520 is installed may be determined based at least in part upon the heat sensitivities, cooling requirements, etc. associated with the various upstream and downstream heat-producing components that are to be installed in the computer system 500. In some embodiments, the circuit board can be adjustably positioned dynamically, during performance of computing operations and cooling operations in the computer system 500, to enable dynamic control of relative cooling of upstream and downstream heat-producing components.

FIG. 6 is a schematic diagram illustrating a side view of a computer system chassis interior that includes an adjustable flow control element, a temperature sensor device, and an air moving device that are communicatively coupled to a controller, according to some embodiments. In some embodiments, system 600 includes a computer system 601 that at least partially comprises at least computer system 200, illustrated and described above with reference to FIG. 2A-B.

In some embodiments, a flow control element can be adjustably positioned to adjust a cross-sectional area of one of the inlet air plenum and bypass air plenum, which can adjust the relative flow rates of air through each of the plenums. The flow control element can, in some embodiments, be dynamically adjusted to provide dynamic control of the relative air flow rates through separate air plenum to enable dynamic control of relative cooling of upstream and downstream heat-producing components in a computer system.

In the illustrated embodiment, system 600 includes a computer system 601 that itself includes a chassis 608 with inlet plate 612 and base plate 610, air moving device 607, upstream components 620, 622 installed in an upstream portion of the computer system 600, and downstream heat-producing components 634 installed in a downstream portion 604 of the computer system 601. The upstream portion 604 includes an inlet air plenum 602 and bypass air plenum 670. Inlet air vents 614 in the inlet plate 612 direct an inlet air flow 616 through the inlet air plenum 602 to cool upstream heat-producing component 622 installed in heat transfer communication with the inlet air plenum 602. Bypass air vents 672, 673, one or more of which can be installed on a different portion of a chassis 608 from the inlet air vents 614, as shown with reference to vent 673, direct a bypass air flow 674 through bypass air plenum 670 to mix with the inlet air flow 616 downstream of the upstream heat-producing component 622 to establish a mixed air flow 636 that removes heat from downstream heat-producing components 634 in the downstream portion 604.

As shown in the illustrated embodiment, a flow control element 680 can be installed in the bypass air plenum 670. In some embodiments, a flow control element comprises a flap that can be adjusted to pivot into the interior space of an air plenum to adjust a cross-sectional area of the air plenum between the flow control element and a boundary of the air plenum. For example, as shown in the illustrated embodiment, flow control element 680 can be coupled to the base plate 610 that establishes a lower boundary of the bypass air plenum 670 and can be controlled to adjustably pivot into and out of the bypass air plenum 670 to adjust a cross-sectional area 682 of the plenum 670 between the flow control element 680 and the lower surface of component 620 that establishes an upper boundary of the bypass air plenum 670. Component 620 can comprise a circuit board, including a motherboard, that supports an upstream heat-producing component 622, which can include a CPU, in heat transfer communication with the inlet air plenum 602.

In some embodiments, a flow control element installed in a particular air plenum that can adjust a cross-sectional area of that plenum can be controlled to adjust the relative air flows through multiple air plenums. For example, when air moving device 607 maintains a particular fixed air flow rate through the computer system 601 chassis interior, the total flow rate through both the inlet air plenum 602 and the bypass air plenum 670 may remain approximately fixed. Adjusting the cross-sectional area 682 of the bypass air plenum 670 via control of the flow control element 680 may adjust the flow rate of the bypass air flow 674, which can result in a complementary change in the inlet air flow 616 rate through the inlet air plenum 602. For example, where the bypass air flow 674 rate is reduced by 1 cubic foot per minute, based upon the flow control element 680 being controlled to reduce the cross-sectional area 682 of the bypass air plenum 670, the inlet air flow 616 rate may increase by approximately 1 cubic foot per minute. Because the inlet air flow 616 removes heat from the upstream heat-producing component 622 and the bypass air flow 674 does not, reducing the cross-sectional area 682 may result in increased cooling of heat-producing component 622 due to an increased flow rate of inlet air flow 616. In addition, because the bypass air flow 674 mixes with the inlet air flow 616 to provide a mixed air flow 636 that has greater heat removal capacity than the inlet air flow 616 alone, reducing the cross-sectional area 682 may result in reduced cooling of heat-producing components 634 due to reduced mixing of the heated inlet air flow 616 with bypass air 674, so that the mixed air flow 636 has a reduced heat removal capacity.

In some embodiments, one or more flow control elements 680 can be installed in both plenums 602, 670, where each flow control element 680 installed in each plenum can be separately controlled to separately adjust a cross-sectional area of a separate one of the plenums.

In some embodiments, one or more flow control elements can be controlled based on sensor data indicating one or more environmental condition measurements in one or more portions of a computer system. The environmental conditions can include one or more of temperature, pressure, flow rate, relative humidity, some combination thereof, or the like. The environmental conditions can be measured by one or more sensor devices installed in one or more portions of the chassis interior of the computer systems, and the sensor data indicating the measurements of the environmental conditions can be processed by a controller to adjust one or more flow control elements in the computer system. The controller may adjust one or more flow control elements to adjust relative flow rates through two or more plenums, may adjust one or more flow control elements to adjust total flow rates through the two or more plenums, some combination thereof, or the like.

In the illustrated embodiment, for example, system 600 includes a controller 690 that is communicatively coupled to flow control element 680 installed in the bypass air plenum 670, an air moving device 607, a temperature sensor device 692 installed in the inlet air plenum 602, and a temperature sensor device 694 installed in the downstream portion 604 of the chassis interior of the computer system 601. Controller 690 can be implemented by one or more computer systems, computing devices, etc., and can adjustably control one or more of the flow control element 680 and the air moving device 607 based on sensor data generated by sensor devices 692, 694. For example, where sensor device 692 indicates that heat-producing component 622 is operating at a temperature that has significant margin below the maximum operating temperature for the heat-producing component 622, while sensor device 694 indicates that heat-producing components 634 are operating approximately at the maximum operating temperature for those heat-producing components 634, controller 690 may adjust flow control element 680 to increase cross-sectional area 682, thereby increasing the bypass air flow 674 and providing a complementary decrease in the inlet air flow 616. In addition, controller 690 may adjust air moving device 607 to reduce the total flow rate through the computer system, so that both the inlet air flow 616 and bypass airflow 674 are reduced. The resulting airflow through the computer system may cause heat-producing components 622 and 634 to each operate approximately at their respective maximum operating temperatures, thereby optimizing airflow distribution through computer system 601.

Figure 7:
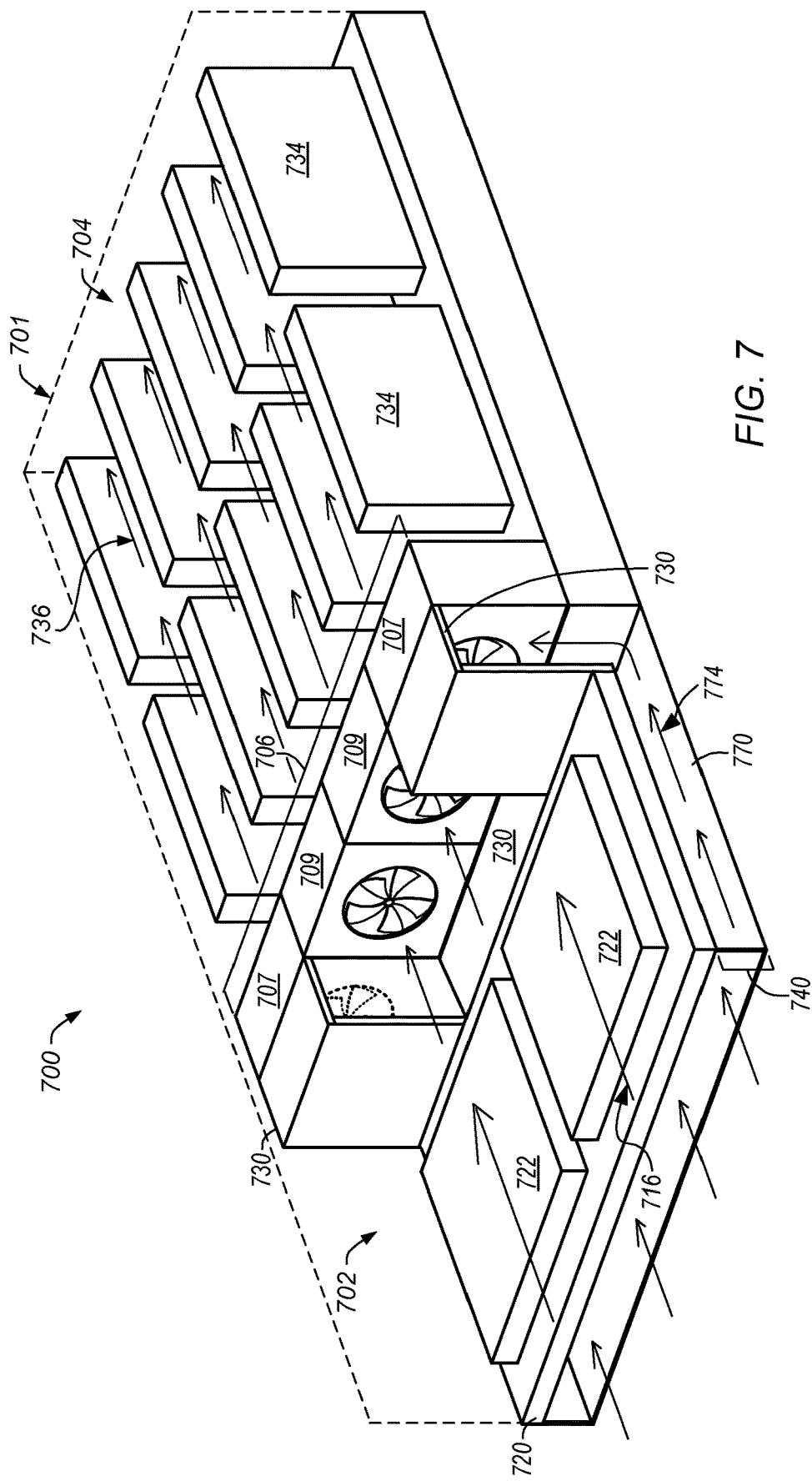
FIG. 7 is a schematic diagram illustrating a perspective view of a computer system that includes partitions that direct separate inlet air flows and bypass air flows through separate sets of air moving devices, according to some embodiments.

FIG. 7 is a schematic diagram illustrating a perspective view of a computer system that includes partitions that direct separate inlet air flows and bypass air flows through separate sets of air moving devices, according to some embodiments. In some embodiments, computer system 700 is at least partially comprised in at least computer system 200, illustrated and described above with reference to FIG. 2A-B.

Computer system 700 includes a chassis 701 in which various upstream heat-producing components 722 are installed in an inlet air plenum 702 in an upstream portion of the chassis interior, and various downstream heat-producing components 734 are installed in a downstream portion 704 of the chassis interior. Heat-producing components 722, in some embodiments, include memory devices and processor unit assemblies, and heat-producing components 734 can include mass storage devices. Heat-producing components 722 are supported by a circuit board 720 which is installed to position the heat-producing components 722 in heat transfer communication with the inlet air plenum 702, and a bypass air plenum 770 extends beneath the circuit board 720 from a bypass air vent 740.

In some embodiments, a computer system includes an array of air moving devices, and one or more sets of air moving devices in the array can be configured to supply airflow exclusively from a particular separate air plenum into the downstream portion of the computer system. A set of air moving devices can be configured thusly based at least in part upon installing partition elements in the chassis interior of the computer system that partition an inlet of each air moving device of the set of air moving devices from plenums other than the particular separate air plenum. As a result, mixing of air flow from separate air plenums can occur downstream of the air moving devices, and separate air flows from separate air plenums can be supplied through a dedicated set of air moving devices. The set of air moving devices dedicated to airflow through a particular plenum may be adjusted, separately from another set of air moving devices dedicated to airflow through another separate plenum, to adjust the airflow through the particular plenum independently of the airflow through the other plenum.

In the illustrated embodiment, for example, computer system 700 includes an array 706 of air moving devices 707, 709 that includes two separate sets of air moving devices that each supply air from a separate air plenum into the downstream portion 704 of the chassis 701 interior. One set of air moving devices 709 are partitioned, on an inlet side of the air moving devices, from the bypass air plenum 770 by various partition elements 730, so that the set of air moving devices 709 exclusively supply the inlet air flow 716 from the inlet air plenum 702 to the downstream portion 704. Conversely, another set of air moving devices 707 are partitioned, on an inlet side of the air moving devices 707, from the inlet air plenum 702 by various partition elements 730, so that the set of air moving devices 707 exclusively supply the bypass air flow 774 from the bypass air plenum 770 to the downstream portion 704. Each set of air moving devices 707, 709 can be separately controlled to provide independent control of the respective air flows 716, 774. For example, one set of air moving devices 707 can be controlled, independently of air moving devices 709, to increase the bypass air flow 774, while the other set of air moving devices 709 maintain a fixed inlet air flow 716. As a result, the mixed air flow 736 through the downstream portion is increased and includes an increased proportion of bypass air flow 774 relative to inlet air flow 716, which can result in an increased cooling of heat-producing components 734 in the downstream portion while maintaining a particular amount of cooling of upstream heat-producing components 722 installed in heat transfer communication with the inlet air plenum 702.

In some embodiments, one or more partition elements 730 can be reversibly installed in various portions of the computer system 701 to change which air moving devices are included in particular sets of air moving devices. For example, some partition elements 730 can be moved from the illustrated mounting configuration in the interior of computer system 700 to partition one or more of the air moving devices 709 to receive air exclusively from the bypass air plenum 770 and to partition one or more of the air moving devices 707 to receive air exclusively from the inlet air plenum 702.

In some embodiments, a computer system includes a bypass air plenum that extends along a side of the computer system chassis that is opposite from the inlet air plenum. The plenum may be bounded on at least one side by a portion of the chassis and may be bounded on other sides by elements that are external to the computer system, including portions of other computer systems. The chassis can include discharge vents that enable a bypass air flow through the bypass air plenum to be discharged into the inlet air plenum, at a point that is downstream of one or more upstream heat-producing components in the inlet air plenum, to mix with the inlet air flow.

Figure 8:
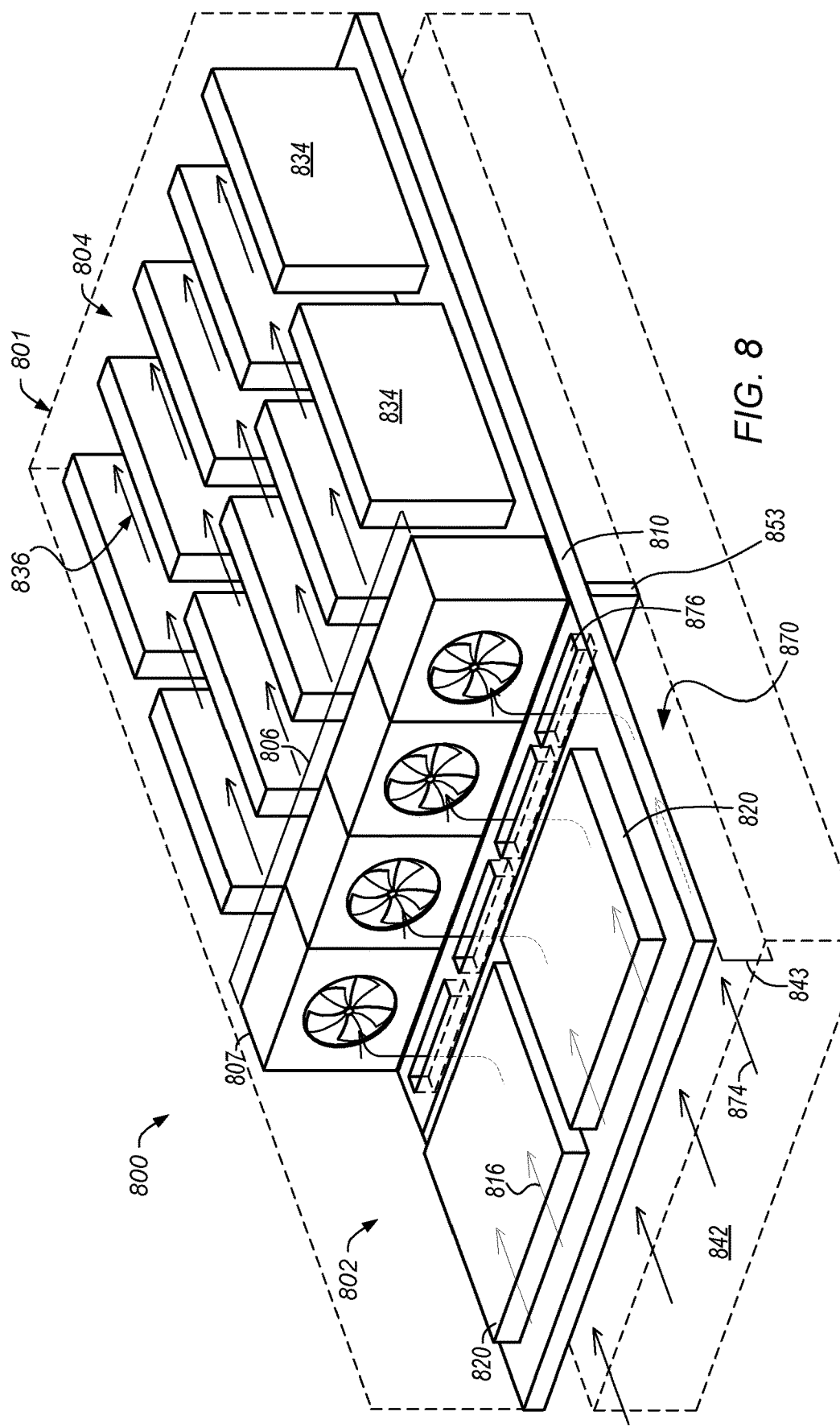
FIG. 8 is a schematic diagram illustrating a perspective view of a computer system that includes bypass vents installed in a base plate of the computer system chassis, according to some embodiments.

FIG. 8 is a schematic diagram illustrating a perspective view of a computer system that includes bypass vents installed in a base plate of the computer system chassis, according to some embodiments. In the illustrated embodiment, rack computing system 800 includes a computer system 801 where the bypass air plenum 870 extends beneath the base plate 810 of a chassis of the computer system 801. The bypass air plenum 870, which may be referred to hereinafter as an "external bypass air plenum," is established based at least in part by the lower surface of the base plate 810, a baffle element 853, and an upper surface of an external element 842. The external element 842, in some embodiments, is another computer system that is separate from computer system 801. For example, in an embodiment where rack computing system 800 includes computer systems installed in a rack, computer system 801 and external element 842 (which may be another computer system) may be installed in a vertical stack in the rack, where gap 843 is present between adjacent computer systems and baffle element 853 substantially partitions the gap space 843 to establish the bypass air plenum 870 of the computer system 801. In some embodiments, system 800 includes a computer system 801 that at least partially comprises at least computer system 200, illustrated and described above with reference to FIG. 2A-B.

In some embodiments, including the illustrated embodiment, discharge vents 876 installed in the base plate 810 direct the bypass air flow 874 out of the bypass air plenum 870 and into an upstream portion 802 of the computer system 801 chassis interior to mix with the inlet air flow 816 at a point in the computer system 801 chassis interior that is downstream of the one or more upstream components 820 installed in the computer system 801. Upstream components 820 can include one or more circuit boards supporting one or more heat-producing components, including central processing units, which generate heat. In the illustrated embodiment, the discharge vents 876 direct the bypass air flow 874 into one or more air moving devices 807 in an array 806 of air moving devices, where the air moving devices 807 supply both the bypass air flow 874 and the inlet air flow 816 into the downstream portion 804 of the computer system 801. As a result, the bypass air flow 874 and inlet air flow 816 are mixed at least partially by the air moving devices 807 to provide a mixed air flow 836 that cools downstream heat-producing components 834 that are installed in the downstream portion 804. In some embodiments, a flow control element, as illustrated and discussed above with reference to FIG. 6, can be installed in one or more of the bypass air plenum 870 and the upstream portion 802.

In some embodiments, a baffle element prevents air recirculation into the bypass air plenum. For example, where mixed air 836 exits the downstream portion 804 of the computer system into an external exhaust air space, and the gap space 843 extends from an inlet end of the rack computing system 800 to an exhaust end that is in communication with the external exhaust air space, baffle element 853 partitions that gap space 843 to prevent exhaust air from recirculating back through the gap space 843 from the exhaust space to heat the bypass air flow 874. Baffle 853 can, in some embodiments, include an insulating material that mitigates heat transfer to the bypass air plenum 870.

Figure 9:
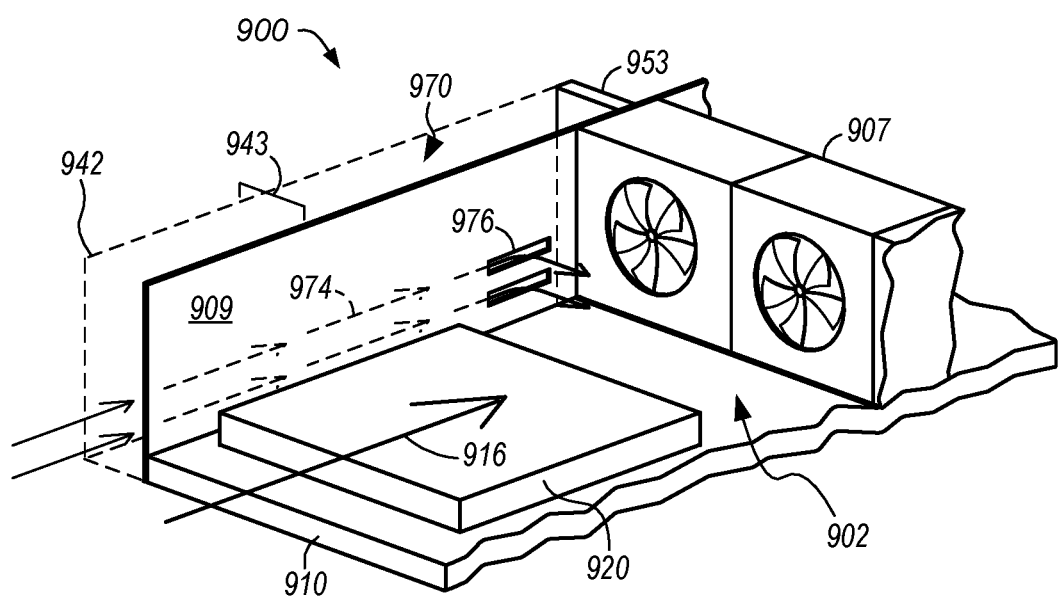
FIG. 9 is a schematic diagram illustrating a perspective view of a computer system that includes bypass vents installed in a side surface of the computer system chassis, according to some embodiments.

FIG. 9 is a schematic diagram illustrating a perspective view of a computer system that includes bypass vents installed in a side portion of the computer system chassis, according to some embodiments. In the illustrated embodiment, computer system 900 includes a bypass air plenum 970, which may be referred to hereinafter as an "external bypass air plenum," that extends alongside a side plate 909 of a chassis of the computer system 900, where the chassis includes at least the side plate 909 and a base plate 910. The bypass air plenum 970 is established based at least in part by the outer surface of the side plate 909, a baffle element 953, and an adjacent surface of an external element 942. The external element 942, in some embodiments, includes another computer system, rack member, etc. that is separate from computer system 900. For example, in an embodiment where computer system 900 is installed in a rack computing system that includes computer systems installed in a rack, element 942 may be a rack member, where gap 943 is present between the computer system 900 installed in the rack and the rack member 942. Baffle element 953 substantially partitions the gap space 943 to establish the bypass air plenum 970 of the computer system 900. Baffle element 953 can prevent air recirculation into the bypass air plenum 970. In some embodiments, computer system 900 is at least partially comprised in at least computer system 200, illustrated and described above with reference to FIG. 2A-B.

Discharge vents 976 installed in the side plate 909 direct the bypass air flow 974 out of the bypass air plenum 970 to mix with the inlet air flow 916 at a point 902 in the computer system 900 that is downstream of the one or more upstream heat-producing components 920. The discharge vents 976 direct the bypass air flow 976 into one or more air moving devices 907.

Figure 10:
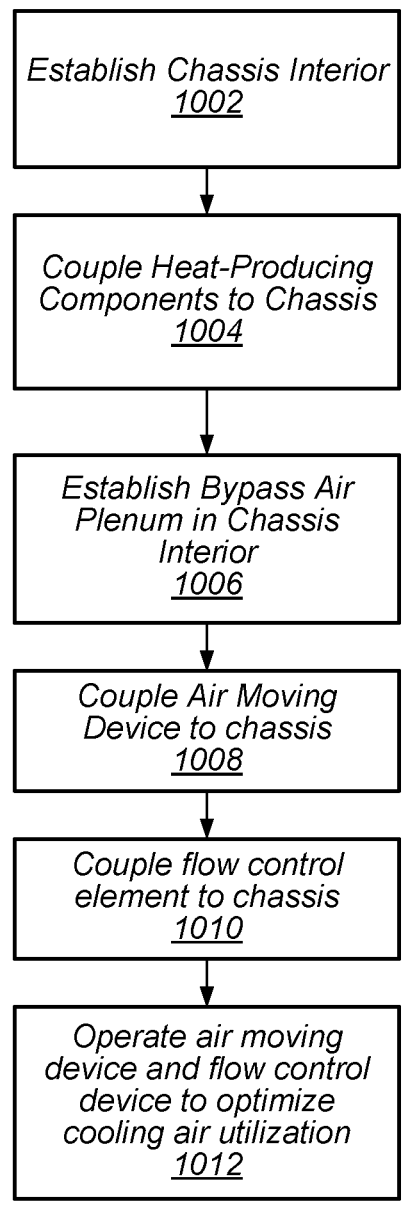
FIG. 10 illustrates a method of providing a bypass airflow in a computer system interior, according to some embodiments.

FIG. 10 illustrates a method of providing a bypass airflow in a computer system interior, according to some embodiments. The method can be implemented using various embodiments of a computer system, including one or more of the embodiments illustrated and described above with reference to FIGS. 1-9.

At 1002, a chassis of a computer system is established, where the chassis at least partially encompasses a chassis interior. The chassis interior can be established by coupling various members together to establish the chassis, where the various members encompass a portion of the chassis interior. An example of chassis members can include a base plate that encompasses one or more lower portions of the chassis interior, side plates that encompass one or more side portions of the chassis interior, inlet plates that encompass one or more side portions of the chassis interior on an end of the chassis that is configured to receive at least an inlet air flow into the chassis interior, etc.

The chassis interior can include an inlet end and an exhaust end. The inlet end of the chassis is configured to face an external source of cooling air, and the exhaust end is configured to face an external exhaust air space. The chassis interior can include some or all of an "upstream" portion that is proximate to the inlet end, a "downstream" portion that is proximate to the exhaust end, and a "midstream" portion that is located between the upstream and downstream portions.

At 1004, one or more heat-producing components are coupled to the chassis to install the heat-producing components in the chassis interior. The various heat-producing components can be included in one or more various components, including one or more mass storage devices, circuit boards, central processing units, etc. For example, one or more sets of mass storage devices, including one or more hard disk drives, can be installed in the downstream portion of the chassis interior. The mass storage devices can be coupled to one or more backplanes that are themselves coupled to the chassis to install the mass storage device. In another example, one or more circuit boards, which can include one or more motherboards supporting central processing units (CPUs), memory cards, etc., can be coupled to the chassis in an upstream portion of the chassis interior to install the circuit boards in the upstream portion.

At 1006, a bypass air plenum is established in at least a portion of the chassis interior. The bypass air plenum is established as a space that is at least partially bounded by one or more portions of the chassis and one or more components coupled to the chassis. In some embodiments, the bypass air plenum is at least partially established by one or more surfaces of a circuit board installed in the upstream portion, where the circuit board is coupled to the chassis to install the circuit board in a particular position that partitions the upstream portion of the chassis interior into separate air plenums.

One plenum can extend above the circuit board and in heat transfer communication with various heat-producing components, including a CPU, installed on an upper surface of the circuit board, while the other plenum extends beneath the circuit board. The one air plenum can include an inlet air plenum, and an inlet air flow through the inlet air plenum can remove heat generated by the various heat-producing components installed in the upstream portion of the chassis interior. The circuit board can be installed in the particular position to enable the bypass air plenum to extend beneath the circuit board to provide at least sufficient spacing between the circuit board and a base plate of the chassis to mitigate the risk of contact between the base plate and various elements of the circuit board, including capacitor elements, stiffening brackets under a CPU, connector tails projecting through the lower surface of the circuit board, etc. In some embodiments, an additional element, including Mylar sheeting, is installed between the circuit board and the base plate to mitigate the risk of electrical shorting.

A bypass air plenum can be established based at least in part upon establishing an air vent in one or more surfaces bounding a space that is unencompassed by the inlet air plenum, so that an air flow can pass through the space in isolation from the inlet air flow and can mix with the inlet air flow at a location in the chassis interior that is downstream from one or more of the upstream heat-producing components installed in heat transfer communication with the inlet air plenum. Air vents can be established in one or more various members comprising the chassis. For example, some air vents can be established in an inlet plate of the chassis, some air vents can be established in a bottom plate of the chassis, and some air vents can be established in a side plate of the chassis.

In some embodiments, one or more components, which can include one or more circuit boards, are coupled to the chassis in one or more various positions to establish one or more various cross-sectional areas of at least the bypass air plenum. Coupling the component in a particular position, which establishes a particular cross-sectional area of the bypass air plenum, can enable a particular flow rate of the bypass air flow through the bypass air plenum. In some embodiments, the one or more components, including one or more circuit boards, can be dynamically adjusted in the chassis interior between various installed positions to dynamically adjust the bypass air flow rate via adjustment of the bypass air plenum cross-sectional area.

At 1008, one or more air moving devices are coupled to the chassis to install the air moving devices in the chassis interior. The air moving device can be coupled to the chassis downstream of both the inlet air plenum and the bypass air plenum in the upstream portion of the chassis interior, so that the inlet air flow and the bypass air flow can at least partially mix upstream of the air moving device. For example, the air moving device can be installed in a midstream portion of the chassis interior that is spaced downstream from a circuit board that isolates the bypass air plenum from the inlet air plenum, so that a gap between the circuit board and the air moving device enables the bypass air flow to be directed from the bypass air plenum to mix with the inlet air flow from the inlet air plenum. In some embodiments, the air moving device is coupled to the chassis in contact with the circuit board, and one or more discharge vents are established in the circuit board to enable the bypass air flow to pass out of the bypass air plenum, through the circuit board, to mix with the inlet air flow.

In some embodiments, a chassis is free from including air moving devices, and the inlet and bypass air flows through the chassis interior can be induced based at least in part upon a pressure gradient through the chassis interior that is induced by an external source, including an externally-mounted air moving device.

At 1010, one or more flow control elements are coupled to the chassis in heat transfer communication with one or more of the inlet air plenum and the bypass air plenum to enable adjustable control of the relative air flow rates through the plenums. The flow control elements can be coupled to one or more surfaces establishing one or more of the boundaries of a plenum to install the flow control elements in the plenum. In some embodiments, the flow control elements can be controlled to adjust a cross-sectional area of the plenum to control air flow rates through at least that particular plenum. In a computer system with a constant total flow rate maintained through the chassis interior, adjusting flow rate through one of the bypass air plenum and the inlet air plenum can induce a complementary change in flow rate in the other air plenum.

In some embodiments, partition elements are installed in the chassis interior to configure one or more air moving devices to supply air received exclusively from one or more particular plenums into a downstream portion of the chassis interior and to configure one or more other air moving devices to supply air received from another particular plenum into the downstream portion. For example, one air moving device can be partitioned to receive air exclusively from the bypass air plenum, and another air moving device can be partitioned to receive air exclusively from the inlet air plenum.

At 1012, the air moving device and flow control element are operated to optimize utilization of the airflow through the chassis interior to cool the various components installed in various portions of the chassis interior. The control of one or more of the flow control elements and air moving devices coupled to the chassis can be implemented by a controller, which can be implemented at least partially by one or more computer systems. The controller can adjustably control one or more of the flow control elements and air moving devices to control cooling of various heat-producing components coupled to the chassis. For example, a flow control element coupled to the chassis in the bypass air plenum can be controlled to change the relative flow rates of the inlet air flow and the bypass air flow, and an air moving device coupled to the chassis can be controlled to change the total induced flow rates of the inlet air flow and the bypass air flow.

The controller, in some embodiments, adjustably controls the air moving devices and flow control elements based at least in part upon sensor data generated by one or more sensor devices installed in the chassis interior. One sensor device may provide temperature measurements proximate to heat-producing components in the inlet air plenum, and another sensor may provide temperature measurements proximate to heat-producing components in the downstream portion of the chassis interior. The controller may control the flow control elements and air moving devices to adjust the rate of cooling of the upstream heat-producing components and downstream heat-producing components, so that at least some of the upstream heat-producing components and the downstream heat-producing components are operating at respective temperatures that are within a certain margin of their respective maximum operating temperatures. Where the number of components in the chassis interior that are operating within the margins of their respective maximum operating temperatures, the utilization of cooling air from an external source can be maximized, such that the minimal air flow rate required to provide sufficient cooling to the components to avoid thermal damage is provided.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computer system, comprising:
   heat producing components mounted in an interior of a chassis;
   a circuit board mounted in the interior of the chassis, wherein:
      one or more of the heat producing components are mounted on a first side of the circuit board;
      a first air plenum is formed between the first side of the circuit board and an upper panel of the chassis, wherein air flowing through the first air plenum cools the one or more of the heat producing components mounted on the first side of the circuit board; and
      a bypass air plenum is formed in the chassis interior between a second side of the circuit board and a lower panel of the chassis, wherein air flowing through the bypass air plenum flows beneath the one or more of the heat producing components mounted on the first side of the circuit board
   a gap between the circuit board and another component of the computer system, wherein another one or more of the heat producing components are mounted to the other component of the computer system; and
   a baffle installed downstream of the gap;
   wherein the gap and the baffle are configured such that:
      the air flowing through the bypass air plenum is channeled, via the gap, to flow out of the bypass air plenum and across the other one or more of the heat producing components mounted on the other component of the computer system.

2. The computer system of claim 1, wherein the other one or more of the heat producing components mounted on the other component of the computer system comprise:
   one or more hard disk drives.

3. The computer system of claim 2, wherein the one or more of the heat producing components mounted on the first side of the circuit board comprise:
   at least one central processing unit (CPU).

4. The computer system of claim 3, wherein:
   the circuit board and the at least one CPU mounted on the circuit board are located in a first portion of the interior of the chassis that receives air flow from an air inlet end of the chassis; and
   the other component of the computer system to which the one or more hard disk drives are mounted is located in a second portion of the interior of the chassis downstream from the first portion.

5. The computer system of claim 4, further comprising:
   one or more fans configured to draw air into the interior of the chassis via the air inlet end of the chassis.

6. The computer system of claim 4,
   wherein the air flowing through the bypass air plenum that is channeled to flow through the gap mixes with air in the first air plenum that has cooled the at least one CPU.

7. The computer system of claim 6,
   wherein bypass air from the bypass air plenum and first plenum air from the first air plenum flow, as mixed air, through the second portion of the interior of the chassis to cool the hard disk drives mounted in the second portion of the interior of the chassis.

8. The computer system of claim 4, wherein the at least one CPU is configured to perform control operations for controlling the one or more hard disk drives.

9. A system for storing data, comprising:
   a rack; and
   a plurality of computer systems mounted on the rack, at least one of the computer systems comprising:
      heat producing components mounted in an interior of a chassis of the at least one computer system;
      a circuit board mounted in the interior of the chassis, wherein:
         one or more of the heat producing components are mounted on a first side of the circuit board;
         a first air plenum is formed between the first side of the circuit board and an upper panel of the chassis, wherein air flowing through the first air plenum cools the one or more of the heat producing components mounted on the first side of the circuit board; and
         a bypass air plenum is formed in the chassis interior between a second side of the circuit board and a lower panel of the chassis, wherein air flowing through the bypass air plenum flows beneath the one or more of the heat producing components mounted on the first side of the circuit board;
      a gap between the circuit board and another component of the at least one computer system, wherein another one or more of the heat producing components are mounted to the other component of the at least one computer system; and
      a baffle installed downstream of the gap;
      wherein the gap and the baffle are configured such that:
         the air flowing through the bypass air plenum is channeled, via the gap, to flow out of the bypass air plenum and across the other one or more of the heat producing components mounted on the other component of the at least one computer system.

10. The system for storing data of claim 9, wherein the other one or more of the heat producing components mounted on the other component of the at least one computer system comprise one or more hard disk drives.

11. The system for storing data of claim 9, wherein the one or more of the heat producing components mounted on the first side of the circuit board comprise at least one central processing unit (CPU).

12. The system for storing data of claim 9, wherein:
the circuit board, and at least one CPU mounted on the circuit board, are located in a first portion of the interior of the chassis that receives air flow from an air inlet end of the chassis; and
the other component of the at least one computer system to which one or more hard disk drives are mounted is located in a second portion of the interior chassis, downstream from the first portion.

13. The system for storing data of claim 9, where the at least one computing system further comprises:
one or more fans configured to draw air into the interior of the chassis via the air inlet end of the chassis.

14. The system for storing data of claim 9, wherein the air flowing through the bypass air plenum that is channeled to flow through the gap mixes with air in the first air plenum that has cooled the one or more of the heat producing components mounted on the first side of the circuit board.

15. The system for storing data of claim 9, wherein bypass air from the bypass air plenum and first plenum air from the first air plenum flow, as mixed air, through the interior of the chassis to cool the other one or more of the heat producing components mounted to the other component of the at least one computing system.

16. A method, comprising:
flowing air through a first air plenum formed between a first side of a circuit board and an upper panel of a chassis, wherein the air flowing through the first air plenum cools one or more heat producing components mounted on the first side of the circuit board;
flowing additional air through a bypass air plenum formed in the chassis interior between a second side of the circuit board and a lower panel of the chassis, wherein the additional air flowing through the bypass air plenum flows beneath the one or more heat producing components mounted on the first side of the circuit board; and
channeling, by a baffle downstream of a gap, the air flowing through the bypass air plenum to flow, via the gap, out of the bypass air plenum and across another one or more heat producing components mounted on another component downstream of the gap.

17. The method of claim 16, further comprising:
mixing the air flowing through the bypass air plenum that is channeled to flow through the gap with air in the first air plenum that has cooled the one or more heat producing components mounted on the first side of the circuit board.

18. The method of claim 16, wherein the other one or more heat producing components mounted on the other component comprise one or more hard disk drives.

19. The method of claim 16, wherein the one or more heat producing components mounted on the first side of the circuit board comprise at least one central processing unit (CPU).

20. The method of claim 16, wherein:
the circuit board, and at least one CPU mounted on the circuit board, are located in a first portion of the interior of the chassis that receives air flow from an air inlet end of the chassis; and
the other component to which one or more hard disk drives are mounted, is located in a second portion of the interior chassis downstream from the first portion.

* * * * *